US009070856B1

(12) United States Patent
Rose et al.

(10) Patent No.: US 9,070,856 B1
(45) Date of Patent: Jun. 30, 2015

(54) WAVEFORM GENERATOR FOR DRIVING ELECTROMECHANICAL DEVICE

(71) Applicant: Misonix Incorporated, Farmingdale, NY (US)

(72) Inventors: Emery Rose, Manhasset, NY (US); Ronald R. Manna, Valley Stream, NY (US); Salvatore Pantano, Farmingdale, NY (US)

(73) Assignee: MISONIX, INCORPORATED, Farmingdale, NY (US)

( * ) Notice: Subject to any disclaimer, the term of this patent is extended or adjusted under 35 U.S.C. 154(b) by 72 days.

(21) Appl. No.: 13/930,253

(22) Filed: Jun. 28, 2013

Related U.S. Application Data

(63) Continuation-in-part of application No. 13/558,947, filed on Jul. 26, 2012, now Pat. No. 8,659,208, which is a continuation of application No. 13/065,644, filed on Mar. 25, 2011, now abandoned, which is a continuation of application No. 12/462,335, filed on Jul. 31, 2009, now abandoned, which is a continuation-in-part of application No. 12/290,733, filed on Nov. 3, 2008, now abandoned, and a continuation-in-part of application No. 12/157,707, filed on Jun. 12, 2008, now abandoned.

(60) Provisional application No. 61/787,624, filed on Mar. 15, 2013, provisional application No. 61/070,091, filed on Mar. 20, 2008, provisional application No. 60/934,546, filed on Jun. 14, 2007.

(51) Int. Cl.
*H01L 41/08* (2006.01)
*H01L 41/04* (2006.01)

(52) U.S. Cl.
CPC .................................. *H01L 41/042* (2013.01)

(58) Field of Classification Search
USPC ........................................ 310/26, 316.01, 317
See application file for complete search history.

(56) References Cited

U.S. PATENT DOCUMENTS

| | | | |
|---|---|---|---|
| 6,016,052 A | 1/2000 | Vaughn | |
| 6,100,654 A | 8/2000 | Izukawa et al. | |
| 6,261,249 B1 | 7/2001 | Talish et al. | |
| 6,630,768 B2 | 10/2003 | Yamashiro et al. | |
| 7,218,030 B2 | 5/2007 | Kasuga et al. | |
| 7,345,401 B2 | 3/2008 | Schief | |
| 2002/0171410 A1* | 11/2002 | Akahane et al. | 324/76.49 |
| 2004/0239381 A1* | 12/2004 | Matsuzaki et al. | 327/109 |
| 2005/0189933 A1 | 9/2005 | Brown | |
| 2005/0285584 A1 | 12/2005 | Kwan | |
| 2007/0096713 A1 | 5/2007 | Perner | |

(Continued)

*Primary Examiner* — Thomas Dougherty
(74) *Attorney, Agent, or Firm* — R. Neil Sudol; Henry D. Coleman

(57) ABSTRACT

An electrical waveform generator for driving an electromechanical load includes a digital signal processor connected to a waveform generator component in turn connected to an amplifier section with a filter network, the latter being connected to sensing and conditioning circuit componentry that is in turn connected to analog-to-digital converter circuitry. A digital memory stores digitized voltage and current waveform information. The processor determines a phase difference between voltage and current waveforms, compares the determined phase difference to a phase difference command and generates a phase error or correction signal. The processor also generates an amplitude error signal for inducing the amplifier section to change its output amplitude to result in a predetermined amplitude error level for a respective one of the voltage and current waveforms.

64 Claims, 7 Drawing Sheets

(56) References Cited

U.S. PATENT DOCUMENTS

2008/0079406 A1  4/2008  Holmquist et al.
2008/0082277 A1  4/2008  Holmquist et al.

* cited by examiner

WAVEFORM GENERATOR FOR DRIVING ELECTROMECHANICAL DEVICE

CROSS-REFERENCE TO RELATED APPLICATIONS

This application claims the benefit of U.S. Provisional Patent Application No. 61/787,624 filed Mar. 15, 2013. In addition, this application is a continuation-in-part of application Ser. No. 13/558,947 filed Jul. 26, 2012, which is a continuation of application Ser. No. 13/065,644 filed Mar. 25, 2011, which in turn is a continuation of application Ser. No. 12/462,335 filed 31 Jul. 2009, which is a continuation-in-part of application Ser. No. 12/157,707 filed Jun. 12, 2008, which claims the benefit of U.S. Provisional Patent Application No. 60/934,546 filed 14 Jun. 2007 and U.S. Provisional Patent Application No. 61/070,091 filed 20 Mar. 2008. Parent application Ser. No. 12/462,335 is also a continuation-in-part of application Ser. No. 12/290,733 filed Nov. 3, 2008.

BACKGROUND OF THE INVENTION

This invention relates to an electrical waveform generator for driving electromechanical devices such as piezoelectric and magnetostrictive transducers.

Tools that are made to vibrate at frequencies above the range of human hearing have been used in science, medicine and industry for many decades. Applications such as cell disruption, bloodless surgery, welding of metals and plastics and sewage treatment are well known to the art.

Ultrasonic devices generally consist of a transducer, which converts electrical energy to mechanical vibration, a probe or horn which amplifies the vibration amplitude of the transducer and an electric or electronic signal generator which converts line or battery power to the AC signal with the frequency and voltage necessary to drive said transducer against the load imposed.

One of the elements of these systems is a limiting factor to greater use of ultrasound energy in the marketplace. This is the signal generator.

Transducers and probes are fairly easily designed and built to meet specific application requirements, such as use as a surgical tool or as a cell disruptor in biosciences. Each transducer and probe combination will have a characteristic resonance curve of impedance vs. frequency, as depicted in FIG. 1. The minimum impedance point $IP_{MIN}$ of the curve is generally regarded as the series resonance and the maximum impedance point $IP_{MAX}$ is considered the anti-resonance or parallel resonance of the transducer. This curve will be either broad (FIG. 1A) or narrow (FIG. 1B). It may also have secondary resonances SR superimposed upon the curve, as shown in FIG. 1C. The absolute value of impedances is also important, in that the dynamic range of the impedances may be quite high from the point where the transducer is unloaded to that where the transducer is fully loaded.

In addition to the impedance vs. frequency characteristic curve, the transducer will undergo a phase shift between voltage and current signals when the frequency is increased from below the resonant points to a point above the both resonances. This phase shift will start as a current leading (−90 degrees) through zero at series resonance, up to current lagging (+90 degrees) back through zero phase shift and down to current lagging. This characteristic phase shift may differ greatly from ideal as the system is loaded highly or if the initial design of the transducer and probe combination is not optimized.

The electronic generator must provide a frequency and voltage/current drive which will keep the transducer and probe vibrating at the desired resonance point against the loads imposed upon it by the application. Traditionally these generators have used phase-locked-loop (PLL) techniques and auto gain circuitry (AGC) well known to the art. In these systems, great compromises are generally made since one generator may not be designed to encompass all known variations of impedance or phase vs. frequency and power requirements that may be encountered in the field. For example, in some systems, the frequency difference between Series and Parallel Resonance may only be a few hertz. Standard PLL systems may require such a low loop gain to capture and lock onto these high Q devices that the system is unstable in normal operating modes. In other systems, the phase characteristic curve may be flattened to the point that the PLL may not recognize the phase shift at series or parallel resonance and therefore not be able to lock onto either when needed.

Therefore, each application may require a different generator design, which is costly and time consuming to engineer. Therefore, many applications go wanting for a solution since no entity is willing to expend the time and money to provide the hardware solution.

One of the reasons for this is that, in conventional electronic design, the hardware must be changed physically for each application. Here, the hardware of the PLL loop must be optimized for each individual application. In addition, the amplifier section of the generator is usually tailored to the maximum power requirement of the particular application at hand, to minimize size and cost. If the next application requires a higher power output, the amplifier is generally redesigned from scratch to achieve this higher output rating.

OBJECTS OF THE INVENTION

It is an object of the present invention to provide an improved electrical waveform generator for driving electromechanical loads such as piezoelectric and magnetostrictive transducers in ultrasonic applications.

A further object of the present invention is to provide such an improved electrical waveform generator that can be applied to a far greater range of transducer, probe and load combinations with a minimum of hardware changes, in comparison with convention electronic signal generators.

Another object of the present invention is to provide such an improved electrical waveform generator that is small and inexpensive.

Yet another object of the present invention is to provide such an improved electrical waveform generator that may reduce the monetary roadblocks to ultrasound solutions in the field.

These and other objects of the invention will be apparent from the drawings and descriptions herein. Although every object of the invention is attained in at least one embodiment of the invention, there is not necessarily any embodiment which attains all of the objects of the invention.

SUMMARY OF THE INVENTION

An electrical waveform generator for driving an electromechanical load comprises, in one principal embodiment of the present invention, a digital signal processor or other digital computing unit (microcontroller, microprocessor), a waveform generator component, an amplifier section, sensing and conditioning circuit componentry, and analog-to-digital converter circuitry. The waveform generator component is connected to an output of the computing unit for digitally synthesizing an electrical waveform of a desired frequency in response to a signal from the computing unit. The amplifier section is connected at a control input to an output of the waveform generator component and adjusts at least one of a voltage and a current of the waveform exemplarily in response to a signal from a rail supply. The amplifier section delivers an output waveform of a desired type to input leads of the electromechanical load. The sensing and conditioning circuit componentry is operatively connected to the amplifier section for sensing and conditioning an output current and an output voltage of the amplifier section across the electromechanical load. The analog-to-digital converter circuitry is connected at an input to the sensing and conditioning circuit components and at an output to the computing unit. The computing unit accesses a digital memory for storing digitized voltage and current waveform information. The computing unit is programmed to process the digitized voltage and current waveform information in the memory to determine at least a phase difference between voltage and current waveforms. The computing unit is further programmed to compare the determined phase difference to a phase difference command and to generate a phase error signal fed at least indirectly to the waveform generator component for causing the same to adjust its output frequency to result in a predetermined phase between voltage and current, or predetermined operating point as a function of phase. The computing unit is additionally programmed to compare at least one of voltage and current amplitude respectively to a voltage amplitude command and a current amplitude command and to generate an amplitude error signal for inducing the amplifier section to change its output amplitude to result in a predetermined amplitude error level for a respective one of the voltage and current waveforms.

The computing means may be also programmed to process a feedback signal from the electromechanical load to determine amplitude and phase characteristics of the feedback signal. The processing of the feedback signal preferably includes using the output frequency of the waveform generator component as a reference wave comprised of a pure fundamental sinusoid of the output frequency in a Fourier decomposition with the feedback signal to determine the phase difference and the one of the voltage and current amplitude as functions of the phase and amplitude of the fundamental sine wave. The processor may be configured to separate out the pure fundamental sinusoid from the feedback signal and determine phase and amplitude information by (a) multiplying samples of one cycle of the fundamental sinusoid with samples of the feedback signal divided by the number of samples, and summing the products, (b) obtaining a real part by using a cosine reference wave and an imaginary part by using a sin reference wave, the real part and the imagining part forming a resultant complex quantity, (c) computing the amplitude of the pure fundamental sinusoid of the feedback signal as the absolute value of the complex quantity, and (d) computing the phase of the pure fundamental sinusoid of the feedback signal as the arctangent of the imaginary part over the real part.

Pursuant to further features of the present invention, the computing unit is programmed to (a) calculate a motional current of the electromechanical load from the waveform data stored in the digital memory, (b) compute a clamped or static capacitance value of the electromechanical load from waveform data stored in the digital memory, and (c) determine resonant frequencies of the electromechanical load from the waveform data stored in the digital memory, the calculated motional current and the computed clamped or static capacitance value. The computing unit may be also programmed to determine an actual mechanical vibration amplitude of the electromechanical load from the calculated motional current.

Pursuant to another feature of the present invention, the electrical waveform generator further comprises a first filter for generating and applying a first signal to the waveform generator component. In the event that a rail supply provides a signal to the amplifier section, a second filter may be provided for generating and applying a second signal to the control input of the rail supply. The first filter and the second filter may be each realized by software and/or hardware.

Pursuant to more features of the present invention, the computing unit may be further programmed to (1) store, in the digital memory, samples of control loop error during start up transients, (2) analyze the samples of control loop error to determine loop performance and stability, (3) use the stored voltage and current waveform information to determine voltage level values, current level values, and thereby calculate power levels taken from the group consisting of real and apparent power levels, (4) display the power levels on a user interface in absolute and/or relative scales or displays, (5) calculate the power factor between voltage and current signals from the waveform signals stored in the digital memory, and (6) display the power factor on the user interface in absolute and/or relative scales or displays.

Pursuant to an additional feature of the present invention, the computing unit may be programmed to (i) resolve a zero cross point of the phase difference to a fine resolution by searching for a plus-to-minus or minus-to-plus change between two adjacent samples, signifying a crossing of the zero axis, (ii) determine a ratio of an A/D value of one of the two adjacent samples to an absolute difference in A/D values between the two adjacent samples, and (iii) multiply the ratio by a sampling period time spacing between the two adjacent samples to determine where the zero cross point occurs, whereby a fine resolution of zero crossing time may be determined.

The computing unit may be further programmed to (A) calculate a power factor between voltage and current signals from waveform signals stored in the digital memory, (B) derive a first phase angle from zero-crossing information and a second phase angle from the power factor, (C) compare the first phase angle with the second phase angle, and (D) generate a phase command for changing the waveform generator frequency to result in the predetermined phase. When the discrepancy is greater than a selected threshold, waveform distortion is indicated and the phase command or reference level is altered.

The computing unit may be programmed to determine at least one of the group consisting of waveform amplitude information, waveform RMS voltage levels, spectral decomposition analysis of waveform information, real or equivalent circuit values of piezoelectric or magnetostrictive resonators, and phase conditions, and phase or amplitude change rates.

The computing unit may maintain a running window of waveform data with respect to time in the digital memory.

In accordance with other features of the present invention, the computing unit is programmed to determine error levels between a resonant frequency of the electromechanical load and waveform generator output and to determine error levels between desired resonator mechanical vibratory amplitude and actual resonator mechanical vibratory amplitude.

The memory may store correlated phase difference commands and amplitude commands.

The computing unit is optionally programmed to vary a phase difference command as a function of command amplitude for optimal tracking of the desired operating point of the electromechanical load (transducer array), to maintain performance as a function of amplitude and load.

The computing unit may be further programmed to maintain control loop error in a type 0 phase locked loop constant, independent of frequency of operation, and to use control loop parameters in a phase locked loop capture mode that may be different than control loop parameters in a phase locked loop locked mode.

In accordance with a further feature of the present invention, the computing unit is programmed to carry out a network analysis automatically upon at least one of (i) detection of an abnormal operating condition and (ii) user command, the computing unit executing a linear sweep from a first frequency to a second frequency to compile an impedance curve and a phase curve, the computing unit storing results of the linear sweep as data samples in the digital memory.

The computing unit may be additionally programmed to operate in a fast pulsing mode, wherein phase-locked-loop parameters including frequency and loop error are held constant while the amplifier section is disabled during a recurring off period, so that the phase-locked-loop parameters are not updated during the off period, and wherein during a recurring on period, the amplifier section is re-enabled and the phase-locked-loop parameters are again updated continuously.

An electrical waveform generator in accordance with the present invention may additionally comprise (a) means for displaying voltage, current, phase and/or impedance curves on a user observable local or remote interface screen and (b) means for deriving system operating and alarm states from displayed curves and visual or audio means for alerting a user as to said operating and alarm states, and may be programmed to respond to alarm conditions by shutting down output, triggering alarms and/or changing output amplitude settings.

The computing unit may be also programmed to compensate for a theoretical voltage drop across a capacitor of a transducer equivalent circuit as a function of load by alternatively increasing and decreasing the output voltage of the amplifier section by approximately a value $Vc_o$ to thereby maintain a theoretical voltage across motional components of the transducer equivalent circuit substantially constant. Value $V_{Co}$ is a voltage drop across the capacitor of the transducer equivalent circuit and is given by the equation:

$$V_{Co}=I*Xc_o=I/(2\pi fC_o)$$

where I is the current, f is the frequency of operation and $C_o$ is the capacitance of the capacitor in the transducer equivalent circuit.

The present invention contemplates a method corresponding to the above-described apparatus. The method comprises, in accordance with the present invention, (a) digitally generating a signal, (b) digitally synthesizing an electrical waveform of a desired frequency in response to the generated signal, (c) variably increasing at least one of a voltage and a current of the electrical waveform to form an output waveform, (d) filtering the output waveform to convert the output waveform to a desired type and delivering it to input leads of an electromechanical load, (e) sensing a current and voltage across the electromechanical load, (f) converting the sensed current and voltage from an analog form to a digital form, and (g) storing the digitized voltage and current waveform information in a digital memory. The method also comprises (h) processing the digitized voltage and current waveform information stored in the memory to determine at least a phase difference between voltage and current waveforms, (i) automatically comparing the determined phase difference to a phase difference command, digitally filtering this result and generating a loop error signal fed at least indirectly to a waveform generator component for causing the same to adjust its output frequency to result in a predetermined operating point as a function of phase, and (j) automatically comparing at least one of voltage and current amplitude respectively to a voltage amplitude command and a current amplitude command, feeding the difference to a loop filter and generating an amplitude error signal applied at least indirectly to an amplifier section for inducing same to change its output amplitude to result in a predetermined amplitude level for a respective one of the voltage and current waveforms.

According to other features of the present invention, the method further comprises (k) automatically calculating a motional current of the electromechanical load from the waveform data stored in the digital memory, (l) automatically computing a clamped or static capacitance value of the electromechanical load from waveform data stored in the digital memory, and (m) automatically determining resonant frequencies of the electromechanical load from the waveform data stored in the digital memory, the calculated motional current and the computed clamped or static capacitance value. Another step may constitute determining an actual mechanical vibration amplitude of the electromechanical load from the calculated motional current.

The method of the invention may also include (1) storing, in the digital memory, samples of control loop error during start up transients, (2) automatically analyzing the samples of control loop error to determine loop performance and stability, (3) automatically using the stored voltage and current waveform information to determine voltage level values, current level values, thereby calculating power levels taken from the group consisting of real and apparent power levels, (4) displaying the power levels on a user interface in absolute and/or relative scales or displays, (5) calculating the power factor between voltage and current signals from the waveform signals stored in the digital memory, and (6) displaying the power factor on the user interface in absolute and/or relative scales or displays.

The method of the invention may additionally include (i) automatically resolving a zero cross point of the phase difference to a fine resolution by searching for a plus-to-minus or minus-to-plus change between two adjacent samples, signifying a crossing of the zero axis, (ii) automatically determining a ratio of an A/D value of one of the two adjacent samples to an absolute difference in A/D values between the two adjacent samples, and (iii) automatically multiplying the ratio by a sampling period time spacing between the two adjacent samples to determine where the zero cross point occurs, whereby a fine resolution of zero crossing time may be determined.

Further method steps may involve (A) automatically calculating a power factor between voltage and current signals from waveform signals stored in the digital memory, (B) automatically deriving a first phase angle from zero-crossing information and a second phase angle from the power factor, (C) automatically comparing the first phase angle with the second phase angle, and (D) automatically generating a phase command for changing the waveform generator frequency to maintain the predetermined operating point as a function of phase.

Other method steps may concern automatically determining at least one of the group consisting of waveform amplitude information, waveform RMS voltage levels, spectral decomposition analysis of waveform information, real or equivalent circuit values of piezoelectric or magnetostrictive resonators, and phase error conditions, and phase or amplitude change rates.

Additional method steps pursuant to the present invention comprise (I) automatically maintaining a running window of waveform data with respect to time in the digital memory, (II) automatically determining error levels between a resonant frequency of the electromechanical load and waveform generator output, (III) automatically determining error levels between desired resonator mechanical vibratory amplitude and actual resonator mechanical vibratory amplitude.

The memory may store correlated phase difference commands and amplitude commands.

The method may also include varying a phase difference command as a function of command amplitude for optimally maintaining the operating point of the electromechanical load. The method may also include maintaining control loop error in a type 0 phase locked loop constant, independent of frequency of operation, and using control loop parameters in a phase locked loop capture mode that may be different than control loop parameters in a phase locked loop locked mode.

A network analysis may be carried out automatically upon at least one of (i) detection of an abnormal operating condition and (ii) user command, the computing unit executing a linear sweep from a first frequency to a second frequency to compile an impedance curve and a phase curve, the computing unit storing results of the linear sweep as data samples in the digital memory.

A fast pulsing mode is possible, wherein phase-locked-loop parameters including frequency and loop error are held constant while the amplifier section is disabled during a recurring off period, so that the phase-locked-loop parameters are not updated during the off period, and wherein during a recurring on period, the amplifier section is re-enabled and the phase-locked-loop parameters are again updated continuously.

An electrical waveform generator for driving an electromechanical load having at least one feedback crystal or coil comprises, in a second principal embodiment of the present invention, a digital signal computing unit, a waveform generator component, an amplifier section, first sensing and conditioning circuit components, second sensing and conditioning circuit components, and analog-to-digital converter circuitry. The waveform generator component is connected to an output of the computing unit for digitally synthesizing an electrical waveform of a desired frequency in response to a signal from the computing unit. The amplifier section is connected at a control input to an output of the waveform generator component for driving the electromechanical device into high power and adjusts at least one of a voltage and a current of the waveform, optionally in response to a signal from a rail supply. The amplifier section delivers an output waveform of a desired type to input leads of the electromechanical load. The first sensing and conditioning circuit components are operatively connected to the amplifier section for sensing and conditioning an output current and an output voltage of the amplifier section across the electromechanical load. The second sensing and conditioning circuit components are operatively connected to the feedback crystal or coil for sensing and conditioning the output of the feedback crystal or coil. The analog-to-digital converter circuitry is connected at inputs to the first and the second sensing and conditioning circuit components and at an output to the computing unit. The computing unit accesses a digital memory for storing digitized voltage and current waveform information from the amplifier section and digitized voltage and current waveform information from the feedback crystal or coil. The computing unit is programmed to process the digitized voltage and current waveform information in the memory to determine at least a phase difference between a feedback signal from the feedback crystal or coil and the transducer voltage or current waveform. The computing unit is further programmed to compare the determined phase difference to a phase difference command and to generate a signal fed at least indirectly to the waveform generator component for causing same to adjust its output frequency to maintain a predetermined operating point as a function of phase. The computing unit is additionally programmed to compare the amplitude of the signal from the feedback crystal or coil to a feedback amplitude command and generate an amplitude error signal (which may be applied at least indirectly to the rail supply) for changing the output amplitude of the amplifier section to result in a predetermined amplitude error level.

Pursuant to further features of the present invention, the second embodiment of an electrical waveform generator further comprises a first filter for generating and applying a first signal to the waveform generator component. Where a rail supply delivers a signal to the amplifier section, a second filter may be provided for generating and applying a second signal to the rail supply. The first filter and the second filter may be realized by software and/or hardware.

The computing unit of the second embodiment may be further programmed to store, in the digital memory, samples of control loop error during start up transients, to analyze the samples of control loop error to determine loop performance and stability, and to use the stored voltage and current waveform information to determine voltage level values, current level values, and thereby calculate power levels taken from the group consisting of real and apparent power levels. Also, the computing unit may be programmed to display the power levels on a user interface in absolute and/or relative scales or displays, to calculate the power factor between voltage and current signals from the waveform signals stored in the digital memory, and to display the power factor on the user interface in absolute and/or relative scales or displays.

According to another feature of the present invention, the computing unit of the second embodiment of the electrical waveform generator is further programmed to resolve a zero cross point of the phase difference to a fine resolution by searching for a plus-to-minus or minus-to-plus change between two adjacent samples, signifying a crossing of the zero axis, to determine a ratio of an A/D value of one of the two adjacent samples to an absolute difference in A/D values between the two adjacent samples, to multiply the ratio by a sampling period time spacing between the two adjacent samples to determine where the zero cross point occurs, whereby a fine resolution of zero crossing time may be determined. The computing unit may calculate a power factor between voltage and current signals from waveform signals stored in the digital memory, to derive a first phase angle from zero-crossing information and a second phase angle from the power factor, to compare the first phase angle with the second phase angle, to generate a phase command for changing the waveform generator frequency to result in the predetermined phase operating point.

The computing unit of the second embodiment may be also programmed to determine an actual mechanical vibration amplitude of the electromechanical load from the feedback signal of the feedback crystal or coil.

The computing unit may be further programmed to compute a clamped or static capacitance value of the electromechanical load from waveform data stored in the digital memory.

The computing unit may be further programmed to determine one or more of the following: (1) phase difference between transducer voltage and current waveforms, (2) transducer voltage waveform amplitude information, (3) current waveform amplitude information, (4) feedback signal phase difference to either voltage or current waveform, (5) feedback signal amplitude and frequency, (6) waveform RMS voltage levels, (7) spectral decomposition analysis of waveform information, (8) real or equivalent circuit values of piezoelectric or magnetostrictive resonators, (9) phase error conditions, and (10) phase or amplitude change rates.

The computing unit may maintain a running window of waveform data with respect to time in the digital memory.

According to additional features of the present invention, the computing unit of the second embodiment is further programmed to determine error levels between a resonant frequency of the electromechanical load and waveform generator output and to determine error levels between desired resonator mechanical vibratory amplitude and actual resonator mechanical vibratory amplitude.

Correlated phase difference commands and amplitude commands may be stored in the digital memory.

According to other features of the present invention, the computing unit of the second embodiment is further programmed to (i) vary a phase difference command as a function of command amplitude for optimal tracking of desired operating point of the electromechanical load, (ii) maintain control loop error in a type 0 phase locked loop constant, independent of frequency of operation, (iii) use control loop parameters in a phase locked loop capture mode that may be different than control loop parameters in a phase locked loop locked mode, and (iv) carry out a network analysis automatically upon at least one of (A) detection of an abnormal operating condition and (B) user command, the computing unit executing a linear sweep from a first frequency to a second frequency to compile an impedance curve and a phase curve, the computing unit storing results of the linear sweep as data samples in the digital memory.

The computing unit of the second embodiment may be further programmed to operate in a fast pulsing mode, wherein phase-locked-loop parameters including frequency and loop error are held constant while the amplifier section is disabled during a recurring off period, so that the phase-locked-loop parameters are not updated during the off period, and wherein during a recurring on period, the amplifier section is re-enabled and the phase-locked-loop parameters are again updated continuously.

A method corresponding to the second embodiment of the apparatus comprises, in accordance with the present invention, (a) digitally generating a signal, (b) digitally synthesizing an electrical waveform of a desired frequency in response to the generated signal, (c) variably increasing at least one of a voltage and a current of the electrical waveform to form an output waveform, (d) filtering the output waveform to convert the output waveform to a desired type and delivering it to input leads of an electromechanical load having at least one feedback crystal or coil, (e) sensing a current and voltage across the electromechanical load, (f) sensing a current and voltage across the feedback crystal or coil, (g) converting the sensed currents and voltages from an analog form to a digital form, and (h) storing the digitized voltage and current waveform information in a digital memory. The method also comprises (i) processing the digitized voltage and current waveform information stored in the memory to determine at least a phase difference between a feedback signal from the feedback crystal or coil and the voltage or current waveform across the electromechanical load, (j) automatically comparing the determined phase difference to a phase difference command and generating a signal fed at least indirectly to the waveform generator component for causing the same to adjust its output frequency to result in a predetermined phase between voltage and current, and (k) automatically comparing the amplitude of the signal from the feedback crystal or coil to a feedback amplitude command and generate an amplitude error signal applied at least indirectly to the control input of the amplifier section for inducing same to change its output amplitude result in a predetermined amplitude level.

Pursuant to further features of the present invention, the method of the second embodiment further comprises (a) filtering the difference between the feedback signal and the commanded phase signal and applying a first error signal to the waveform generator component, and (b) filtering the difference between the feedback signal and commanded amplitude signal and applying a second error signal to the control input of the amplifier section.

Other potential steps of the second embodiment include storing, in the digital memory, samples of control loop error during start up transients, analyzing the samples of control loop error to determine loop performance and stability, using the stored voltage and current waveform information to determine voltage level values, current level values, and thereby calculating power levels taken from the group consisting of real and apparent power levels. More steps include displaying the power levels on a user interface in absolute and/or relative scales or displays, calculating the power factor between voltage and current signals from the waveform signals stored in the digital memory, and displaying the power factor on the user interface in absolute and/or relative scales or displays.

According to another feature of the present invention, the method of the second embodiment includes (A) automatically resolving a zero cross point of the phase difference to a fine resolution by searching for a plus-to-minus or minus-to-plus change between two adjacent samples, signifying a crossing of the zero axis, (B) determining a ratio of an A/D value of one of the two adjacent samples to an absolute difference in A/D values between the two adjacent samples, and (C) multiplying the ratio by a sampling period time spacing between the two adjacent samples to determine where the zero cross point occurs, whereby a fine resolution of zero crossing time may be determined.

Additional optional steps of the second embodiment include calculating a power factor between voltage and current signals from waveform signals stored in the digital memory, deriving a first phase angle from zero-crossing information and a second phase angle from the power factor, comparing the first phase angle with the second phase angle, and generating a phase command for changing the waveform generator frequency to maintain the predetermined operating point.

One might also automatically determine an actual mechanical vibration amplitude of the electromechanical load from the feedback signal of the feedback crystal or coil and/or compute a clamped or static capacitance value of the electromechanical load from waveform data stored in the digital memory.

Another optional step of the second embodiment is determining one or more of the following: (1) phase difference between transducer voltage and current waveforms, (2) transducer voltage waveform amplitude information, (3) current waveform amplitude information, (4) feedback signal phase difference to either voltage or current waveform, (5) feedback signal amplitude and frequency, (6) waveform RMS voltage levels, (7) spectral decomposition analysis of waveform information, (8) real or equivalent circuit values of piezoelectric or magnetostrictive resonators, (9) phase error conditions, and (10) phase or amplitude change rates.

Generally, it is contemplated that one maintains a running window of waveform data with respect to time in the digital memory. Correlated phase difference commands and amplitude commands may be stored in the digital memory.

According to additional features of the present invention, the method of the second embodiment further includes automatically determining error levels between a resonant frequency of the electromechanical load and waveform generator output and automatically determining error levels between desired resonator mechanical vibratory amplitude and actual resonator mechanical vibratory amplitude.

According to other features of the present invention, additional optional method steps include (i) automatically varying a phase difference command as a function of command amplitude for optimal tracking of desired operating point of the electromechanical load, (ii) automatically maintaining control loop error in a type 0 phase locked loop constant, independent of frequency of operation, (iii) automatically using control loop parameters in a phase locked loop capture mode that may be different than control loop parameters in a phase locked loop locked mode, and (iv) automatically carrying out a network analysis automatically upon at least one of (A) detection of an abnormal operating condition and (B) user command, the computing unit executing a linear sweep from a first frequency to a second frequency to compile an impedance curve and a phase curve, the computing unit storing results of the linear sweep as data samples in the digital memory.

Further optional steps of the second embodiment of the invention include operating in a fast pulsing mode, wherein phase-locked-loop parameters including frequency and loop error are held constant while the amplifier section is disabled during a recurring off period, so that the phase-locked-loop parameters are not updated during the off period, and wherein during a recurring on period, the amplifier section is re-enabled and the phase-locked-loop parameters are again updated continuously.

A method for driving an electrostrictive or magnetostrictive transducer at or near parallel resonance comprises, in accordance with another aspect of the present invention, (a) applying an amplifier output voltage across the transducer and (b) using voltage and current feedback to calculate a motional voltage of a transducer equivalent circuit having capacitive, inductive and resistive components. The calculating of the motional voltage includes subtracting a voltage drop across a static capacitor of the transducer equivalent circuit as a function of load and maintaining constant a theoretical voltage across motion components of the transducer equivalent circuit. The method further comprises (c) modifying the output voltage by the calculated value of the motional voltage, and (d) feeding a current to the transducer in an amount to maintain the voltage drop across the transducer at the modified value of the output voltage.

An electronic generator to drive an electromechanical load comprises, in a particular embodiment of the present invention, (i) a waveform generator component digitally synthesizing an electrical waveform of a desired frequency, (b) an amplifier section, sensing and conditioning circuit components, analog-to-digital converter circuitry, and a computer or microprocessor. The amplifier section, connected at a control input to an output of the waveform generator component, adjusts at least one of a voltage and a current of the waveform and generates an output waveform of a desired type and for delivery to input leads of the electromechanical load. The sensing and conditioning circuit components are operatively connected to the amplifier section for sensing and conditioning an output current and an output voltage of the amplifier section across the electromechanical load. The analog-to-digital converter circuitry is connected at inputs to the sensing and conditioning circuit components. The computer or microprocessor is operatively connected to the waveform generator component and the analog-to-digital circuitry for analyzing voltage and current information and generating a control signal fed to the waveform generator component. The computer or microprocessor accesses a digital memory for storing digitized voltage and current waveform information from the amplifier section and is programmed to process the digitized voltage and current waveform information in the memory to determine at least a phase difference between a motional current and voltage. The computer or microprocessor is further programmed to compare the determined phase difference to a phase difference command and to generate a phase error or correction signal fed at least indirectly to the waveform generator component for causing same to adjust its output frequency to result in a predetermined operating point as a function of phase. The computer or microprocessor is programmed to calculate a motional phase angle $\theta_m$ of the Mason model as the inverse cosine of the total current I times the cosine of the phase angle $\theta_I$ between the measured voltage and current divided by the motional current $I_m$:

$$\theta = a \cos [(I \cos \theta_I)/I_m]$$

where motional current $I_m$ is obtained by subtracting the current $IC_0$ through the capacitor $C_0$ from the total current I, the computing means varying the commanded operating point (motional phase angle $\theta_m$) as a function of load.

A method for driving an electrostrictive or magnetostrictive transducer at or near resonance comprises, in accordance with a particular embodiment of the present invention, (A) applying an amplifier output voltage across the transducer, (B) using voltage and current feedback to calculate a total current I and its phase angle $\theta_I$ with respect to the voltage in the motional branch of the Mason model, (C) automatically calculating a motional phase angle $\theta_m$ of the Mason model as the inverse cosine of the total current I times the cosine of the phase angle $\theta_1$ between the measured voltage and current divided by the motional current $I_m$:

$$\theta_m = a \cos [(I \cos \theta_I)/I_m].$$

where motional current $I_m$ is obtained by subtracting the current $IC_0$ through the capacitor $C_0$ of the Mason model from the total current I, and (D) varying a commanded operating point by varying the motional phase angle $\theta_m$ as a function of load.

A method for driving an electrostrictive or magnetostrictive transducer at or near parallel resonance comprises, in accordance with the present invention, (i) applying an amplifier output voltage across the transducer, (ii) processing a feedback signal from the transducer to determine amplitude and phase characteristics of the feedback signal, (iii) using the determined amplitude and phase characteristics to calculate a motional voltage of a transducer equivalent circuit having capacitive, inductive and resistive components, (iv) modifying the output voltage by the calculated value of the motional voltage and (v) feeding a current to the transducer in an amount to maintain the voltage drop across the transducer at the modified value of the output voltage.

Where the output voltage has an output frequency, the processing of the feedback includes using the output frequency as a reference wave comprised of a pure fundamental sinusoid of the output frequency in a Fourier decomposition with the feedback signal to determine the phase and amplitude of the fundamental sine wave.

The processing of the feedback may more particularly include separating out the pure fundamental sinusoid from the feedback signal and determining phase and amplitude information by: (a) multiplying samples of one cycle of the fundamental sinusoid with samples of the feedback signal divided by the number of samples, and summing the products, (b) obtaining a real part by using a cosine reference wave and an imaginary part by using a sin reference wave, the real part and the imagining part forming a resultant complex quantity, (c) computing the amplitude of the pure fundamental sinusoid of the feedback signal as the absolute value of the complex quantity, and (d) computing the phase of the pure fundamental sinusoid of the feedback signal as the arctangent of the imaginary part over the real part.

Preferably, just a single cycle is used in any one determination of amplitude and phase. It is also preferably that only the fundamental sinusoid of the feedback signal is determined, the harmonics being irrelevant to driving the electrostrictive or magnetostrictive transducer at or near parallel resonance.

BRIEF DESCRIPTION OF THE DRAWINGS

FIG. 1*d* is a graph of voltage and current phase relationship vs. frequency for ultrasonic transducer and horn assemblies.

DETAILED DESCRIPTION

Figure 1:
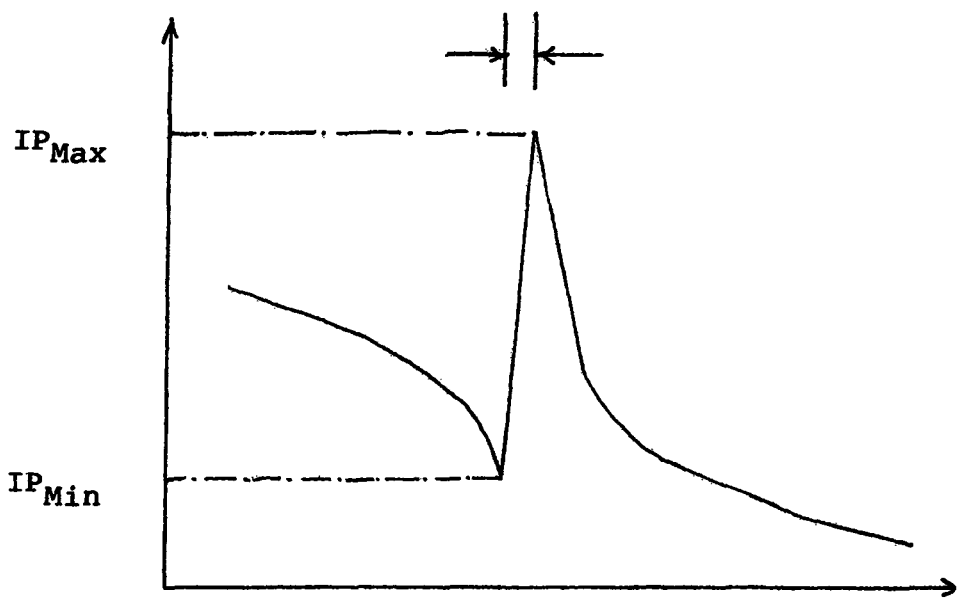
FIGS. 1 and 1A-1C are graphs of impedance as a function of frequency, showing representative response curves for ultrasonic transducer and horn assemblies.
Figure 1A:
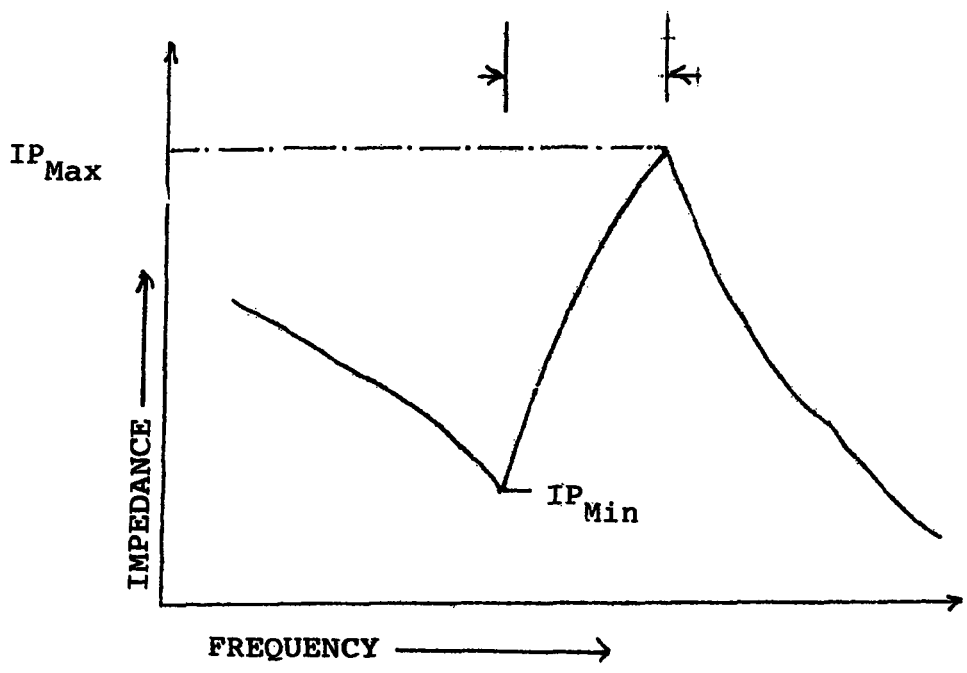
Figure 1B:
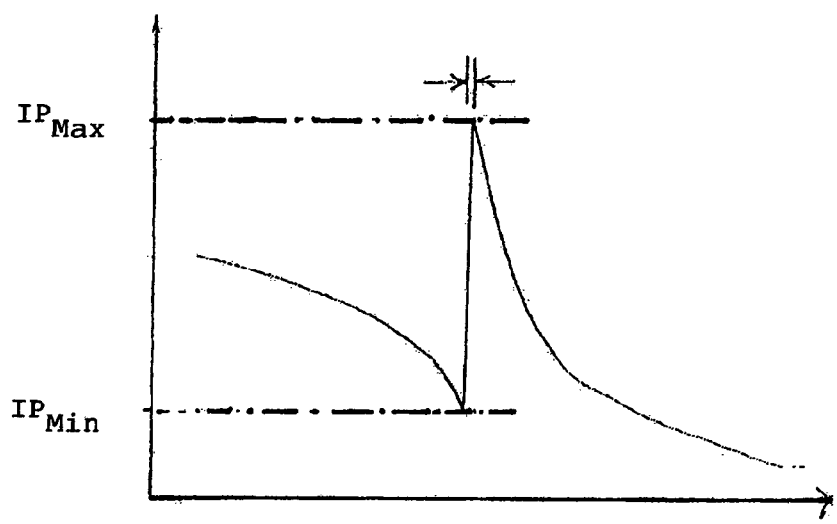
Figure 1C:
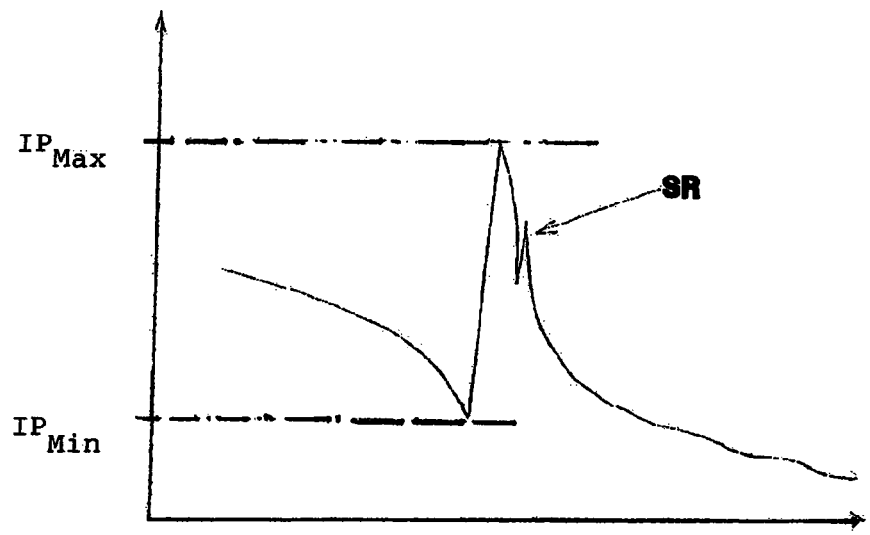
Figure 2:
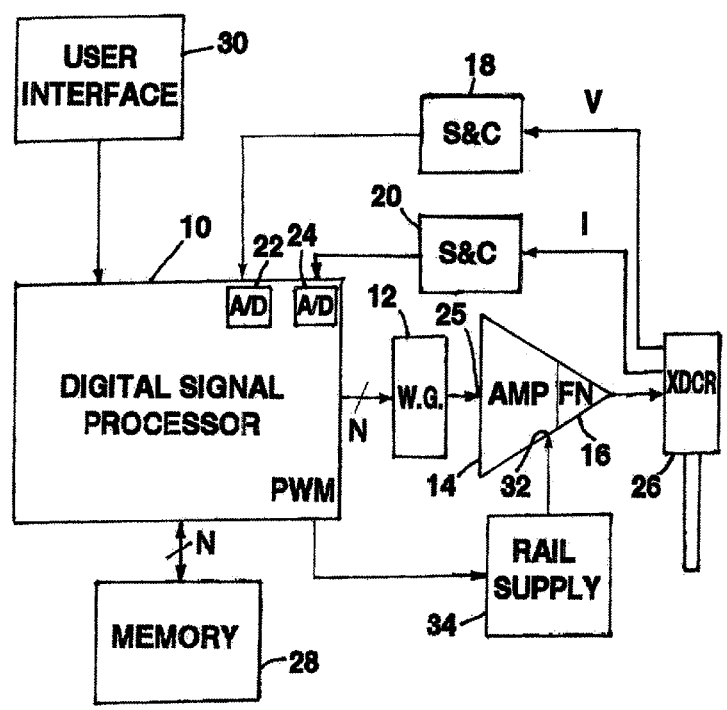
FIG. 2 is a block diagram of a digital waveform generating circuit in accordance with the present invention.

As shown in FIG. 2, an electrical waveform generator for driving an electromechanical load 26 comprises a digital signal processor 10, a waveform generator component (W.G.) 12, an amplifier section 14 with a filter network 16, sensing and conditioning (S & C) circuit components 18 and 20, and analog-to-digital converter circuitry 22 and 24. Digital processor 10 is a microcomputer, microcontroller or, preferably, a digital signal processing (DSP) controller chip. Waveform generator component 12 is a operationally connected to the output data bus of the DSP 10 for generating voltage output signals having a frequency that is a function of the data output of DSP 10.

Amplifier section 14 may be of an analog type or, preferably, a switching amp type. Amplifier section 14 is connected at a control input 25 to an output of waveform generator component 12 for variably increasing the frequency of the waveform in response to a signal on the control input. A rail supply 34 or other control inputs may be used to vary the output signal of amplifier 14. The output signal level may vary in amplitude or in pulse width. Amplifier 14 contains matching or filter circuits 16 to condition the output to a desired shape, such as, but not limited to, a sine wave and to deliver it to input leads or terminals of the electromechanical load 26, for example, an ultrasound transducer. Such a transducer may be a single or multiple crystals, of the Langevin Sandwich type, a folded cylinder type or other such device well known to the art.

Thus, DSP 10 generates driving frequency and amplitude control signals that are fed to amplifier section 14 via waveform generator component 12 and control input 25 and via rail supply 34 and control input 32, respectively. Waveform generator component 12 responds to data input by the DSP 10 with commensurate frequency output signals. The output of rail supply 34 varies as a function of a PWM duty cycle. Amplifier section 14 drives the ultrasonic transducer 26 at the frequency input by waveform generator component 12 and the amplitude input by rail supply 34.

Sensing and conditioning circuit components 18 and 20 are operatively connected to filter network 16 and across electromechanical load or transducer array 26 for sensing an output voltage (V) and an output current (I) of filter network 16 across the load. Analog-to-digital converter circuits 22 and 24 are connected at an input to sensing and conditioning circuit components 18 and 20 and at an output to processor 10. Sensing and conditioning circuit components 18 and 20 and analog-to-digital converter circuits 22 and 24 cooperate to inform DSP 10 as to the amplitude vs. time of the voltage and current drive signals in and through the ultrasonic transducer load 26. The amplitude of the voltage drive signal is derived from the output of the A/D converters 22 and 24 directly.

A user interface circuit 30 is coupled to DSP 10 to enable a user to input, as independent variables, transducer output amplitude levels and nominal frequency of operation and/or other such variables as may be required for a particular application.

DSP 10 includes an integral or separate digital memory 28 for storing digitized voltage and current waveform information. DSP 10 samples the digital representation of the voltage and current by means of sensing and conditioning circuit components 18 and 20 and analog-to-digital converter circuits 22 and 24 at a rate that is greater than at least twice the frequency of operation of the waveform generator component 12 and preferably, at a much higher frequency than that. One or more cycles of operation are stored for computation and processing in digital memory 28.

DSP 10 is programmed to process the digitized voltage and current waveform information in memory 28 to determine at least a phase difference between voltage and current waveforms. DSP 10 is further programmed to compare the determined phase difference to a phase difference command (reference phase) and to generate a phase error or correction signal fed at least indirectly to waveform generator component 12 for causing the same to adjust its output frequency to maintain a predetermined phase between voltage (V) and current (I). DSP 10 is additionally programmed to compare voltage and/or current amplitudes to a voltage amplitude command (reference voltage) and a current amplitude command (reference current) and to generate an amplitude error signal applied at least indirectly to a control input 32 of amplifier section 14 via rail supply 34 for inducing the amplifier section to change its output amplitude to result in a predetermined amplitude error level for the voltage and/or current waveform.

DSP 10 is programmed to (a) calculate a motional current of ultrasonic transducer 26 from the waveform data stored in memory 28, (b) compute a clamped or static capacitance value of ultrasonic transducer 26 from waveform data stored in memory 28, and (c) determine resonant frequencies of ultrasonic transducer 26 from the waveform data stored in memory 28, the calculated motional current and the computed clamped or static capacitance value. DSP 10 may be also programmed to determine an actual mechanical vibration amplitude of ultrasonic transducer 26 from the calculated motional current.

The amplitude of vibration of ultrasonic transducer 26 is proportional to the motional component of the current. The motional current through transducer 26 is defined as current through the theoretical equivalent load motional impedance $Z_m$. The motional current may be calculated by the vector subtraction, from the total current, of the current through the known clamped or static capacitance value of ultrasonic transducer 26. The clamped capacitance value may be measured or calculated with transducer 26 at rest and is entered into memory 28 as a constant by exciting the transducer off resonance with an arbitrary voltage, sampling voltage and total current instantaneously and using the algorithm $C_o = I_t / j\omega V$. This motional current calculation using the clamped capacitance value is entered into memory 28. Alternatively, if a single known transducer is to be used, the clamped capacitance value may be determined with commercially available capacitance meters and then that value may be programmed into memory 28 by the user or designer. Further calculations allow DSP 10 to determine the amplitude of the motional current, from analysis of the theoretical models known to the art, such as the KLM or Mason models of transducer equivalent circuits.

The operating point of ultrasonic transducer 26 may be determined by the phase angle between voltage and either the total current or motional current. DSP 10 determines the frequency operating point of transducer 26 by analyzing the phase angle between the transducer drive voltage signal and either transducer current or transducer motional current. If the operating point is not at the desired conditions, the computing means will derive an error signal. This error signal is then sent to the waveform generator component 12, which will increase or decrease the frequency until the phase angle is as desired or (at least) one that will generate a minimum loop error.

The amplitude operating point will be determined by DSP 10, which will develop an error signal proportional to the difference in the desired motional current or total current from the actual. This error signal will be sent to rail supply 34 to adjust the drive signal levels. Such error signals are derived from hardware or software loop filters (see discussion below), which are known to the art.

If the desired operating point is to be at series resonance, the voltage and current (total or motional) signals must be virtually in phase, for example, in the case of series resonance or near the point of 0 degrees phase difference and the motional current will be a maximum for a given amplitude of drive signal. If the desired operating point is to be at anti-resonance or parallel resonance, then the phase between the voltage and motional current is also virtually 0, but the amplitude of the motional current will be a minimum, for given amplitude of drive signal. Alternatively, the user or designer may input a desired operating point, which differs from that of either series or anti-resonance.

The control algorithms that maintain operation at or near the resonance of transducer 26 and maintain vibration amplitude as commanded by a designer or user are implemented with software loop filters. DSP 10 may incorporate in software a first loop filter for receiving the phase signal and applying a first phase error signal to waveform generator component 12 and a second loop filter for receiving the difference between feedback and commanded phase and applying a second error signal to rail supply 34. The first filter and the second filter may alternatively be realized by hardware.

In the case of software loop filters, DSP 10 maintains windows of loop error in memory 28. Based thereon, DSP 10 determines control loop performance and makes appropriate adjustments to loop filter parameters such as gain, lead and lag or PID parameters as is well known in the art. DSP 10 stores samples of loop error on start-up, which is of particular concern in feedback control performance evaluation. DSP 10 can interrogate or process the signals associated with the loop window of error that occurred at start up of one ultrasonic "on" period upon the completion of a subsequent off period, where ultrasonic operation has ceased, such as in the case of a user releasing a depression of a foot switch. An adaptive algorithm is thus implemented such that if DSP 10 determines that the loop response is too underdamped, as one example, the DSP can reduce the gain, or adjust lead or lag as appropriate in software. The windows of loop error can also be used to determine a heavily loaded transducer condition exists wherein the phase curve has flattened to a condition wherein the commanded phase is unattainable.

When this occurs in a conventional system, such a system will normally respond by increasing the error to the oscillator to the point where the operating point will cross over to the other resonance point (series resonance to parallel resonance or vice versa). With this condition, the loop error correction sense will be in the wrong direction, causing the operating point, or frequency, to shoot over to the end of the system frequency response in the wrong direction. This is why most conventional systems have a restart controller operated by a frequency limit window that is triggered by this condition. DSP 10 can respond to this condition by interrogating an area of memory 28 where the frequency error samples are stored, enabling a history of loading to be derived. If an overload condition as above is detected, the digital electrical waveform generator of FIG. 2 may try to stay at an optimal maximum power frequency and alarm the user instead of continuously restarting with no useful power delivery.

Voltage, current and amplitude samples stored in memory 28 may also enable DSP 10 to detect error conditions such as an arcing, damaged, or broken transducer.

To address the condition of a loaded transducer with a well-known flattened phase transfer function, the phase command may be varied as a function of amplitude command. For example, in the case where the amplitude command is low, and the transducer is immersed in a liquid, the lack of cavitation at low amplitude will cause the phase transfer function to remain flattened through capture and lock of the PLL. The invention will lower the phase angle command in proportion with lower amplitude commands.

DSP 10 is further programmed to (1) store, in memory 28, samples of control loop error during start up transients, (2) analyze the samples of control loop error to determine loop performance and stability, (3) use the stored voltage and current waveform information to determine voltage level values, current level values, and thereby calculate power levels taken from the group consisting of real and apparent power levels, (4) display the power levels on user interface 30 in absolute and/or relative scales or displays, (5) calculate the power factor between voltage and current signals from the waveform signals stored in memory 28, and (6) display the power factor on the user interface 30 in absolute and/or relative scales or displays.

The power factor of the output, known to the art as the cosine of the phase angle difference between the voltage and current signals may be used to determine that a distorted transducer voltage or current waveform exists by using the equation $$\emptyset_{app} = \cos^{-1}(\text{watts}/VA)$$

where $\emptyset_{app}$ is the apparent phase angle between transducer voltages. This value is then compared against the phase detected by means of the zero crossing information (see following paragraph). If the two values are not in agreement, a distorted wave may be the cause. DSP 10 would then generate a phase command that would move the drive frequency up or down until the two values are in reasonable agreement.

The phase angle between the voltage drive signal and the current signal is determined by means of zero crossing points in the stored waveforms or in the frequency domain by complex Fourier analysis. In the former case, DSP 10 resolves the zero cross points for the determination of phase and frequency by considering the samples in memory across zero to be a triangle. The ratio of the A/D values of the point below zero to the point above zero can be applied to the sampling period along zero to resolve the zero cross to the space on the horizontal or time axis between the sample periods. More specifically, DSP 10 is programmed to (i) resolve a zero cross point of the phase difference to a fine resolution by searching for a plus-to-minus or minus-to-plus change between two adjacent samples, signifying a crossing of the zero axis, (ii) determine a ratio of an A/D value of one of the two adjacent samples to an absolute difference in A/D values between the two adjacent samples, and (iii) multiply the ratio by a sampling period time spacing between the two adjacent samples to determine where the zero cross point occurs, whereby a fine resolution of zero crossing time may be determined.

DSP 10 is further programmed to (A) calculate a power factor between voltage and current signals from waveform signals stored in memory 28, (B) derive a first phase angle from zero-crossing information and a second phase angle from the power factor, (C) compare the first phase angle with the second phase angle, and (D) generate a phase command for changing the output frequency of waveform generator component 12 to result in the commanded phase to be achieved.

DSP 10 is programmed to determine one or more of the following: waveform amplitude information, waveform RMS voltage levels, spectral decomposition analysis of waveform information, real or equivalent circuit values of piezoelectric or magnetostrictive resonators, and phase error conditions, and phase or amplitude change rates.

DSP 10 may maintain a running window of waveform data with respect to time in memory 28 and store correlated phase difference commands and amplitude commands.

DSP 10 is supplementarily programmed to determine error levels between a resonant frequency of ultrasonic transducer 26 and output of waveform generator component 12 and to determine error levels between desired resonator mechanical vibratory amplitude and actual resonator mechanical vibratory amplitude.

DSP 10 is optionally programmed to vary a phase difference command as a function of command amplitude for optimal tracking of desired operating point of ultrasonic transducer 26, to ensure acceptable performance as a function of amplitude and load.

To address the common problem of operating point variation as a function of resonant frequency in a PLL control strategy, a digital signal processor can deploy a Type 0 loop filter in software, wherein the loop error is always adjusted to a constant loop error, independent of frequency of operation, so that the operating point is always the same (point of operation on the phase transfer function). This mode of operation would be analogous to adjusting the frequency difference between $F_0$ (the free running frequency) and the running frequency of a hard-wired PLL to always be the same value. This is so that more or less loop error as required to drive the frequency from $F_0$ to resonance as a function of frequency difference between $F_0$ and resonance always ends up the same. The system may also use integrators to achieve the same effect in Type 1 or Type 2 loop filters.

In order to effect a fast capture and stable operation after lock, DSP 10 also uses control loop parameters in a phase locked loop capture mode that may be different than control loop parameters in a phase locked loop locked mode. The PLL loop parameters, such as loop gain, lead, and lag or PID are not constant between the states where the unit is in capture mode and once lock is attained. An example may be that loop gain is higher when capturing to achieve a faster capture, and then lowered when locked to attain for very stable operation.

DSP 10 is additionally programmed to carry out a network analysis automatically upon (i) detection of an abnormal operating condition or (ii) user command. In that event, DSP 10 executes a linear sweep from a first frequency to a second frequency, i.e., across the window of operation of the system, to compile an impedance curve and a phase curve. DSP 10 stores results of the linear sweep as data samples in memory 28. DSP 10 thus tabulates a buffer of impedance and phase at each frequency point. DSP 10 may also look at waveforms and do an FFT or other such calculation to determine the integrity of said feedback signals. The unit thus functions as both a network analyzer (frequency domain), and an oscilloscope (time domain) for diagnostic evaluation.

If required, DSP 10 may be programmed to operate in a fast pulsing mode, wherein the ultrasound is rapidly started and then stopped repeatedly. In this mode, phase-locked-loop parameters including frequency and loop error are held constant while amplifier section 14 is disabled during a recurring off period, so that the phase-locked-loop parameters are not updated during the off period, and wherein during a recurring on period, amplifier section 14 is re-enabled and the phase-locked-loop parameters are again updated continuously. In other words, DSP 10 freezes the PLL loop parameters at the point where ultrasound delivery is suspended. Ultrasound delivery is suspended by turning off amplifier 14. In this way, at the point where ultrasound is once again to be delivered, no capture is required. The PLL continues where it left off. The loop is analyzed as described and adjusted to maintain stable performance only after a stable feedback signal is obtained. Since the amplitude control loop is much faster than the PLL, the response is much faster.

The operation of the waveform generator circuit of FIG. 2 is generally in accordance with the programming of DSP 10.

Figure 3:
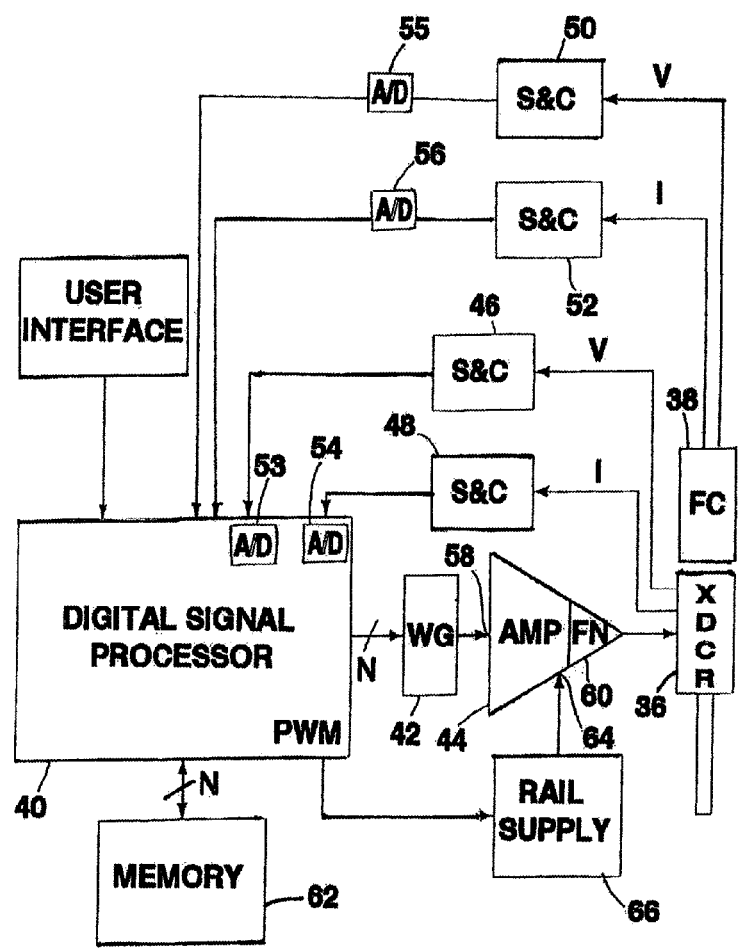
FIG. 3 is a block diagram of another digital waveform generating circuit in accordance with the present invention.

FIG. 3 illustrates an electrical waveform generator for driving an electromechanical load 36 having at least one feedback crystal or coil (FC) 38. The piezoelectric crystal or coil 38 will generate a voltage and current as it is being mechanically vibrated. This signal will change amplitude in direct proportion to the amplitude changes in the vibration of transducer 36 and the frequency of the crystal or coil will be the same as the frequency of vibration of the transducer itself. Such schemes are well known to the art.

By comparing the output of the feedback device 38 to the drive voltage or current, a phase difference may be obtained in the time domain. A DSP 40 (FIG. 3) may compare this phase difference against a commanded or predetermined phase difference to calculate a phase error and set a phase error command to a waveform generator component 42 through conditioning means. The frequency of the synthesized waveform will be varied up or down until the phase error is zero or as commanded. Likewise, the amplitude of the feedback signal may be compared to a commanded signal level. In this way, the amplifier output signal level may be adjusted to maintain the amplitude of the transducer against varying loads or change in amplitude commands. In cases where the feedback element is provided, the system would not necessarily be required to calculate motional information or control on transducer current and voltage phase differences. Such transducer current and voltage information may be desired, however to determine power and power factor information, for instance.

The waveform generator of FIG. 3 in the main incorporates the features discussed above with respect to FIG. 2. Differences between the embodiments of FIGS. 2 and 3 arising from the utilization of feedback crystal or coil 38 will be apparent from the discussion below.

The waveform generator of FIG. 3 comprises a digital signal processor 40, waveform generator component (W.G.) 42, an amplifier section 44, first sensing circuit components 46 and 48, second sensing circuit components 50 and 52, and analog-to-digital converter circuitry 53-56. Waveform generator component 42 is connected to an output of processor 40 for digitally synthesizing an electrical waveform of a desired frequency in response to a signal from the processor. Amplifier section 44 is connected at a control input 58 to an output of waveform generator component 42 and increases at least one of a voltage and a current of the waveform in response to a signal from a rail supply 66 connected to a control input 64. Amplifier section 44 includes a filter network 60 to convert an output waveform of the amplifier section to a desired type and to deliver it to input leads of electromechanical load 36. First sensing circuits 46 and 48 are operatively connected to filter network 60 for sensing an output voltage and an output current of the filter network across electromechanical load 36. Second sensing circuits 50 and 52 are operatively connected to feedback crystal or coil 38 for sensing the output of the feedback crystal or coil. Analog-to-digital converter circuits 53-56 are connected at inputs to the first and the second sensing circuit components 46, 48, 50, 52 and at an output to processor 40. Processor 40 includes a digital memory 62 for storing digitized voltage and current waveform information from filter network 60 and digitized voltage and current waveform information from the feedback crystal or coil 38. Processor 40 is programmed to process the digitized voltage and current waveform information stored in memory 62 to determine at least a phase difference between a feedback signal from feedback crystal or coil 38 and the transducer voltage or current waveform, that is the voltage or current across electromechanical load 36. Processor 40 is further programmed to compare the determined phase difference to a phase difference command (reference phase) and to generate a phase error or correction signal fed at least indirectly to waveform generator component 42 for causing the waveform generator component to adjust its output frequency to maintain a predetermined phase between voltage and current. Processor 40 is additionally programmed to compare the amplitude of the signal from feedback crystal or coil 38 to a feedback amplitude command (reference amplitude) and generate an amplitude error signal applied rail supply 66 for inducing the same to change the output amplitude of amplifier section 44 to result in a predetermined amplitude error level.

This electrical waveform generator further comprises (a) a first filter realized as software of processor 40 for generating a first signal in accordance with the computed phase error and applying the first signal to waveform generator component 42, and (b) a second filter realized as software of processor 40 for generating a second signal in accordance with the amplitude error and applying the second signal to rail supply 66. The first filter and the second filter may alternatively be realized by hardware.

Processor 40 is further programmed to store, in memory 62, samples of control loop error during start up transients, to analyze the samples of control loop error to determine loop performance and stability, and to use the stored voltage and current waveform information to determine voltage level values, current level values, and thereby calculate power levels taken from the group consisting of real and apparent power levels. Also, processor 40 may be programmed to display the power levels on a user interface 68 in absolute and/or relative scales or displays, to calculate the power factor between voltage and current signals from the waveform signals stored in memory 62, and to display the power factor on user interface 68 in absolute and/or relative scales or displays.

Processor 40 is additionally programmed to resolve a zero cross point of the phase difference to a fine resolution by searching for a plus-to-minus or minus-to-plus change between two adjacent samples, signifying a crossing of the zero axis, to determine a ratio of an A/D value of one of the two adjacent samples to an absolute difference in A/D values between the two adjacent samples, and to multiply the ratio by a sampling period time spacing between the two adjacent samples to determine where the zero cross point occurs, whereby a fine resolution of zero crossing time may be determined. Processor 40 may calculate a power factor between voltage and current signals from waveform signals stored in memory 62, to derive a first phase angle from zero-crossing information and a second phase angle from the power factor, to compare the first phase angle with the second phase angle, to generate a phase command for changing waveform generator component 42 frequency to maintain the predetermined operating point, i.e., the predetermined phase between voltage and current.

Processor 40 is also programmed to determine an actual mechanical vibration amplitude of electromechanical load 36 from the feedback signal of feedback crystal or coil 36.

Processor 40 may be further programmed to compute a clamped or static capacitance value of electromechanical load 36 from waveform data stored in memory 62.

Processor 40 may be further programmed to determine one or more of the following: (1) phase difference between transducer voltage and current waveforms, (2) transducer voltage waveform amplitude information, (3) current waveform amplitude information, (4) feedback signal phase difference to either voltage or current waveform, (5) feedback signal amplitude and frequency, (6) waveform RMS voltage levels, (7) spectral decomposition analysis of waveform information, (8) real or equivalent circuit values of piezoelectric or magnetostrictive resonators, (9) phase error conditions, and (10) phase or amplitude change rates.

Processor 40 may maintain a running window of waveform data with respect to time in memory 62.

Processor 40 is further programmed to determine error levels between a resonant frequency of electromechanical load 36 and output of waveform generator component 42 and to determine error levels between desired resonator mechanical vibratory amplitude and actual resonator mechanical vibratory amplitude.

Correlated phase difference commands and amplitude commands may be stored in memory 62.

Processor 40 is also programmed to (i) vary a phase difference command as a function of command amplitude for optimal tracking of desired operating point of electromechanical load 36, (ii) maintain control loop error in a type 0 phase locked loop constant, independent of frequency of operation, (iii) use control loop parameters in a phase locked loop capture mode that may be different than control loop parameters in a phase locked loop locked mode, and (iv) carry out a network analysis automatically upon either (A) detection of an abnormal operating condition or (B) user command. Processor 40 executes a linear sweep from a first frequency to a second frequency to compile an impedance curve and a phase curve. Processor 40 stores results of the linear sweep as data samples in memory 62.

Processor 40 may be programmed to operate in a fast pulsing mode, wherein phase-locked-loop parameters including frequency and loop error are held constant while amplifier section 44 is disabled during a recurring off period, so that the phase-locked-loop parameters are not updated during the off period, and wherein during a recurring on period, amplifier section 44 is re-enabled and the phase-locked-loop parameters are again updated continuously.

The embodiments of FIGS. 2 and 3, whether a feed back crystal 38 is used or not, has the capacity to analyze voltage and current waveforms created by the generator. Therefore, it is possible with the present invention to display voltage, current, impedance and phase in the same way as a commercial network analyzer or oscilloscope, on a screen attached locally to the generator enclosure or, with communication means known to the art, on a remote display. Likewise, other outputs of waveform analysis may be displayed.

Along with the display, alarm features may be programmed in, such as but not limited to impedance limits or operating frequency limits. If the calculated values are outside the preprogrammed specs, actions may be taken such as sounding an audible alarm, lowering amplitude command signals or other such user or designer programmed actions.

The circuit and control software described above provide satisfactory results in running an electrostrictive vibratory load (transducer and accompanying probes) 26 or 36, especially in series resonant mode. It has also been shown to provide good results in driving an electrostrictive transducer at or near parallel (open circuit) resonance mode.

However, an improvement may be made to the performance of the system when it is desired to run in parallel resonance in terms of regulation of the output vibratory amplitude of the system under increasing loads.

Figure 4:
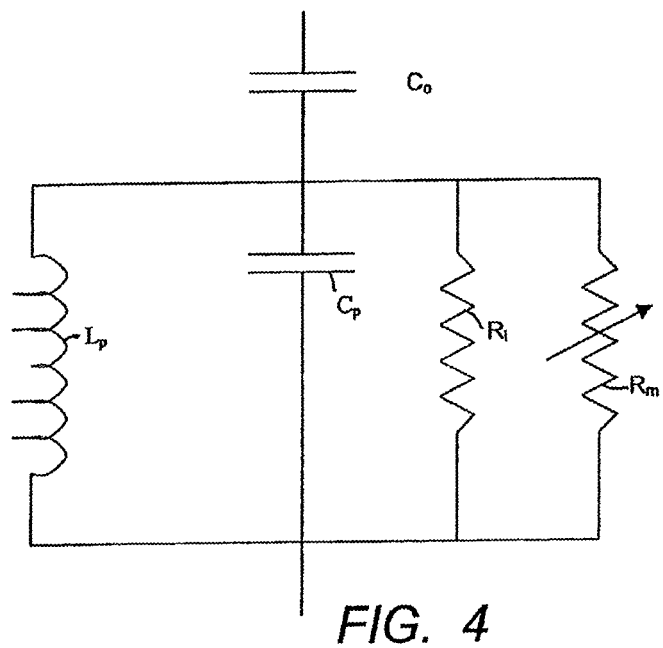
FIG. 4 is a diagram of an electrostrictive transducer equivalent circuit, for transducer and vibratory probe, in parallel resonant mode.

An electrostrictive transducer equivalent circuit in parallel resonant mode may be modeled as shown in FIG. 4.

Figure 5:
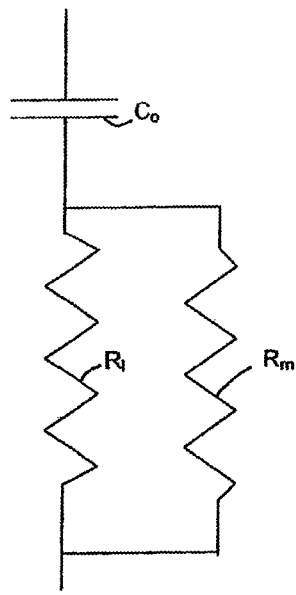
FIG. 5 is a diagram of the equivalent circuit of FIG. 4 when the drive frequency is at or very near the transducer's parallel resonant frequency.

When the drive frequency is at or very near the transducer's parallel resonant frequency, the $L_p$ and $C_p$ reactances will cancel and leave the equivalent circuit to be as shown in FIG. 5. The circuit of FIG. 5 can be categorized as a voltage divider, with the sum of the voltage drop across capacitor $C_o$ (due to its reactance) and that across parallel circuit of resistors $R_i$ and $R_m$ equaling the drive voltage $V_d$.

As is known in the art, when the external mechanical load on a transducer running at parallel resonance is increased, such as when pressing the tip of a vibrator harder against firm tissue in a surgical system, the resistance of the motional resistor $R_m$ gets smaller, while resistance $R_i$ will remain constant. This causes greater current to flow through the motional resistor $R_m$. Since the sum of the voltage drops across the capacitor $C_o$ and resistor circuit $R_i$ and $R_m$ must be equal to voltage $V_d$, a greater voltage drop across the static capacitor $C_o$ is apparent. Therefore, the voltage across motional resistance $R_m$ will decrease.

In order to maintain constant amplitude in the ultrasonic vibrator, a constant voltage should be maintained across the motional components. In the above-described circuit design, the amplitude of vibration will get smaller in proportion to the smaller drive voltage across the motional components as the tips are loaded.

It is desired, therefore, to have an operational control method wherein the voltage across the motional components remains substantially constant as the resistance of motional resistor $R_m$ lowers.

In prior art that relied on analog circuitry to control the electrostrictive transducer, an external inductor would be placed in series with the transducer input leads. This inductor's value would be calculated by measuring the static capacitance of the transducer and using known electronic theory to create a circuit wherein the reactance of the static capacitance of the transducer would be canceled by the reactance of the inductor at or near the parallel resonance frequency of the transducer. Then, the impedance of the capacitor $C_o$ would be effectively zero and the voltage across the motional components of the transducer would be constant. This is described in detail in U.S. Pat. No. 3,432,691 to Shoh. Although the method described by Shoh is effective, it has the limitation that additional components are needed for the product. More importantly, the method of Shoh has a very narrow operating frequency bandwidth because the reactance of the inductor and capacitor would not cancel each other as the drive frequency is moved away from the original design frequency. Therefore, the generator component values would need to be changed for each desired operating frequency.

An improvement may be made using the DSP control scheme described hereinabove.

When it is desired to run in parallel resonance mode, digital signal processor 40 provides a fixed drive voltage to the transducer 36. The auto gain control feature will vary the current drive to keep the voltage constant at differing load conditions. In this scheme, the output amplitude of the transducer 36 will vary as described above. However, digital signal processor 40 can also calculate the capacitance $C_o$ of the transducer 36. Improvement resides in the use by digital signal processor 40 of an algorithm to calculate the impedance of the static (or clamped) capacitor ($C_o$) of transducer 36 at the drive frequency. This algorithm uses the known equation for reactive impedance $Xc_o$:

$$Xc_o = 1/2\pi f C_o$$

The feedback means provides data on the current I and the voltage of the drive signal. Therefore, processor 40 may calculate the voltage drop $V_{Co}$ across the capacitor $C_o$ of the equivalent circuit by the equation:

$$V_{Co} = I * Xc_o = I/(2\pi f C_o)$$

By means of this new algorithm, processor 40 can compensate for the theoretical voltage drop across capacitor $C_o$ as a function of load by increasing or decreasing the drive voltage over that of the original command by the value of $Vc_o$ and thus maintain the theoretical (motional) voltage across the transducer equivalent circuit motional components constant at the reference or command voltage, not above or below the voltage command. In order to maintain stability of the system, the amount of drive voltage increase or decrease may not exactly equal the theoretical $Vc_o$, but may be varied empirically for best operating mode.

In this scheme, both the drive voltage and current are varied as load conditions demand. For example, as the load on the transducer 36 increases, the current will increase to keep the voltage constant across the new lower impedance. However, processor 40 will set a slightly higher voltage command as well, to compensate for the increased $C_o$ impedance. Upon a lowering of the mechanical load, the converse will be true. Processor 40 will demand a slightly lower voltage across the transducer 36 and the current will then reduce commensurately. In this way, the voltage across the theoretical motional components is kept substantially constant. It should be understood that the same control logic may be applied to generators running magnetostrictive type devices as opposed to electrostrictive devices.

Q, which is derived from the word "quality," is a numerical characterization of sharpness of the curve in the graph of impedance as a function of frequency (see FIGS. 1 and 1A-1C). Q may be calculated as the quotient of the series resonance frequency over the difference between the parallel resonance frequency and the series resonance frequency. Generally it is recognized that the Q of the ultrasonic transducer changes as a function of load. The higher the load, the lower the Q value. The Q value also varies as a function of how close to resonance the operating point is. The closer the operating point is to resonance, the higher the Q.

In calculating the voltage drop $V_{Co}$ across the capacitor $C_o$ of the equivalent circuit $C_o$ using the above equation for $V_{Co}$, the capacitance $C_o$ is determined at each command for ultrasound (at each activation of the system) prior to PLL capture. The computer is programmed to take impedance readings ($V_{rms}/I_{rms}$ @ $f=f_x$) at successive frequency points over a predetermined range or band of frequencies. The computer determines if the response is flat within a reasonable tolerance. Response flatness would indicate that there are no resonances in the selected band of frequencies. If there are resonances, the impedance will vary as a series and then a parallel resonance are passed through. If the routine (under which the computer operates) finds resonances, the routine moves to another prescribed band of frequencies until it finds one devoid of resonances. When a band of frequencies containing no resonances is found, the routine performs a spectral decomposition (DFT or FFT) of the electrical waves being fed back (orig. art) at a frequency at the mid point of this frequency band to assure that the waves are sinusoidal. Sinusoidal fidelity or low harmonic distortion is necessary for a simple and fast calculation of $C_o$. The routine then determines the relative phase between the current and voltage waves to be sure they are at or close to 90 degrees. This assures a capacitive load. The routine then determines $C_o$ by means of the voltage, current, and frequency (use of frequency is possible by low distortion sin waves) information ($C=I/[j\omega V]$), as is well known in the art.

The value of $C_o$ so computed then used in the equation to calculate the voltage drop $V_{Co}$ across the capacitor $C_o$ of the equivalent circuit $C_o$ by using the equation:

$$V_{Co}=I*Xc_o=I/(2\pi f C_o),$$

the value $V_{Co}$ being used to "compensate for the theoretical voltage drop across capacitor $C_o$ as a function of load by increasing or decreasing the drive voltage over that of the original command by the value of $Vc_o$ and thus maintain the theoretical voltage across the transducer equivalent circuit motional components constant."

Figure 6:
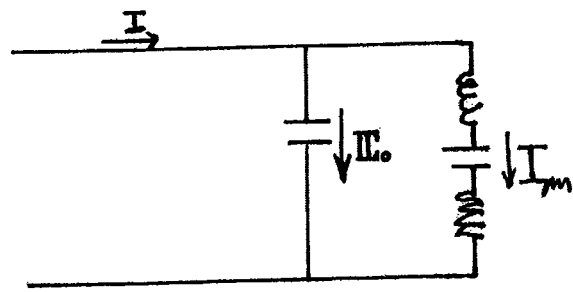
FIG. 6 is a diagram of a Mason equivalent piezo crystal model, for transducer and vibratory probe.
Figure 7:
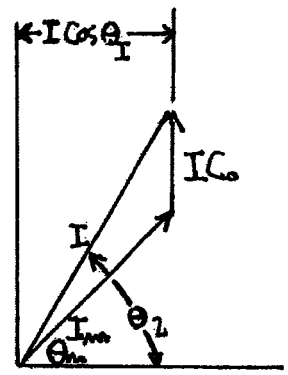
FIG. 7 is a phasor diagram of current components shown in FIG. 6 and their phase angles relative to voltage.

In another modeling of a digital waveform generating circuit with feedback (FIG. 3), for improving the performance of the system whether run in series or in parallel resonance under increasing loads, FIG. 6 shows a Mason equivalent piezo crystal model with total current I, capacitor current $IC_0$, and motional current $I_m$. FIG. 7 shows a phasor diagram of current components shown in FIG. 6 and their phase angles relative to voltage. By known computational means using feedback data, digital signal processor 40 computes the total current I and its phase angle $\theta_I$ with respect to the voltage in the motional branch of the Mason model. The motional phase angle $\theta_m$ is the inverse cosine of the total current I times the cosine of the phase angle $\theta_I$ between the measured voltage and current divided by the motional current $I_m$:

$$\theta_m = a\cos[(I\cos\theta_I)/I_m].$$

Motional current $I_m$ is obtained by vector subtraction of the current $IC_0$ through the capacitor $C_0$ from the total current I. Motional current $I_m$ is obtained by subtracting the current $IC_0$ through the capacitor $C_0$ from the total current I.

Digital signal processor 40 calculates load by determining voltage or loop error and varies the commanded operating point (motional phase angle $\theta_m$) as a function of load. As the converter is loaded, the PLL and AGC control loops can be stable at operating points that are increasingly closer to resonance.

It is known that one cannot operate a digital waveform generator circuit always at resonance because instability arises for unloaded conditions. The Q value is too high at resonance. The system with feedback control as described above with reference to FIGS. 6 and 7 allows running just off resonance in unloaded conditions and moving even closer towards resonance as load increases. Running closer to resonance reduces the voltage increase that would otherwise be required to drive the load. This is particularly advantageous where the transducer crystal has a maximum voltage tolerance (e.g., 1400 volts). The system maintains a given vibration amplitude with the lowest voltage possible and also optimizes the ability to maintain commanded amplitude under load due to the additional headroom before maximum voltage of the handpiece is reached.

It has been discovered that a conventional phase detector of a PLL for ultrasound control is degraded in its performance by waveform distortion, and if severe enough, the distortion will render it inoperable. This is true of both the zero cross method of phase detection and the exclusive OR function of a typical PLL like the 4046.

The method of phase detection disclosed hereinabove utilizes digital sampling to detect a set of samples representing each of a voltage and a current waveform present at the transducer 26, 36. In order obviate the effects of signal distortion, processor 10, 40 is configured to use the output frequency (which is known, pre-determined) as a reference wave comprised of a pure fundamental sinusoid of the output frequency. Processor 10, 40 uses this pure fundamental sinusoid of said output frequency in a type of Fourier decomposition with the feedback signal to determine the phase and amplitude of the fundamental sine wave regardless of the amount of distortion. The orthogonality of the sine waves (transcendental functions) is exploited to pick out the pure fundamental from the feedback wave to determine phase and amplitude information. The samples of one cycle of the fundamental multiply the samples of the feedback divided by the number of samples, and this is summed. A real part is obtained in this way by using a cosine reference wave, and an imaginary part is obtained by using a sin reference wave. The amplitude is the absolute value of the resulting complex quantity, and the phase is the arctangent of the imaginary part over the real part. One cycle is used for speed of processing. (More can be used.) Also, only the fundamental is determined because the harmonics are irrelevant to the control process. This makes the computation fast. This is a brick wall filter accomplished through spectral decomposition picking out only the fundamental out of the distorted composite waveform.

Figure 8:
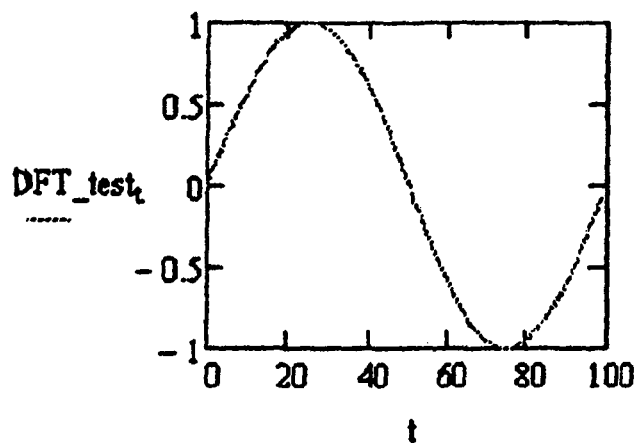
FIG. 8 is a graph of a feedback wave analyzed by a processor of a distal waveform generating circuit in accordance with the present invention, for purposes of eliminating distortion.

FIG. 8 is a graph of a feedback wave with DTF (digital Fourier Transform) on one cycle showing detection of phase (THETA) and amplitude (DFT_ABS_VAL). The following equations pertain:

$$t := 0..99$$

$$\text{DFT\_test}_t := \sin\left[\frac{2 \cdot \pi \cdot (t+0)}{100}\right]$$

$$\text{DFT\_re} := \left[\sum_t \left[\left[\text{DFT\_test}_t \cdot \left[\cos\left[(2 \cdot \pi)\frac{t}{100}\right]\right]\right]\right]\right]$$

$$\text{DFT\_im} := \sum_t \left[\text{DFT\_test}_t \cdot \left(\sin\left(2 \cdot \pi \frac{t}{100}\right)\right)\right]$$

$$\text{DFT\_re} = -1.651 \times 10^{-15}$$

$$\text{DFT\_im} = 50$$

$$\Theta := a\tan\left(\frac{\text{DFT\_im}}{\text{DFT\_re}}\right)$$

$$\Theta \cdot \frac{180}{\pi} = -90$$

$$\text{DFT\_ABS\_VAL} := \sqrt{(\text{DFT\_re})^2 + (\text{DFT\_im})^2}$$

$$\text{DFT\_ABS\_VAL} = 50$$

Figure 9:
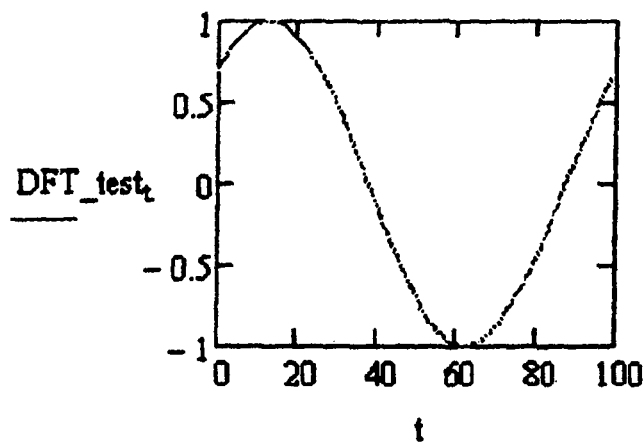
FIG. 9 is a graph of another feedback wave analyzed by a processor of a distal waveform generating circuit in accordance with the present invention, for purposes of eliminating distortion.

FIG. 9 is a graph of a feedback wave with DTF on one cycle showing detection of phase (THETA) shifted to 45 degrees and amplitude (DFT_ABS_VAL). The following equations pertain:

$$t := 0..99$$

$$\text{DFT\_test}_t := \sin\left[\frac{2 \cdot \pi \cdot (t+12.5)}{100}\right]$$

$$\text{DFT\_re} := \left[\sum_t \left[\left[\text{DFT\_test}_t \cdot \left[\cos\left[(2 \cdot \pi)\frac{t}{100}\right]\right]\right]\right]\right]$$

$$\text{DFT\_im} := \sum_t \left[\text{DFT\_test}_t \cdot \left(\sin\left(2 \cdot \pi \frac{t}{100}\right)\right)\right]$$

$$\text{DFT\_re} = 35.355$$

$$\text{DFT\_im} = 35.355$$

$$\Theta := a\tan\left(\frac{\text{DFT\_im}}{\text{DFT\_re}}\right)$$

$$\Theta \cdot \frac{180}{\pi} = 45$$

$$\text{DFT\_ABS\_VAL} := \sqrt{(\text{DFT\_re})^2 + (\text{DFT\_im})^2}$$

$$\text{DFT\_ABS\_VAL} = 50$$

Figure 10:
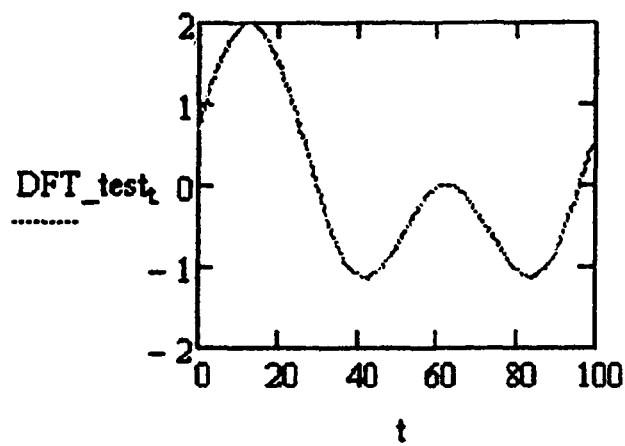
FIG. 10 is a graph of yet another feedback wave analyzed by a processor of a distal waveform generating circuit in accordance with the present invention, for purposes of eliminating distortion.

FIG. 10 is a graph of a feedback wave with DTF (digital Fourier Transform) on one cycle showing detection of phase (THETA) shifted to 45 degrees and amplitude (DFT_ABS_VAL) with a distorting harmonic present. The following equations pertain:

$$t := 0..99$$

$$\text{DFT\_test}_t := \sin\left[\frac{2 \cdot \pi \cdot (t+12.5)}{100}\right] + \sin\left[\frac{2 \cdot (2 \cdot \pi \cdot t)}{100}\right]$$

$$\text{DFT\_re} := \left[\sum_t \left[\left[\text{DFT\_test}_t \cdot \left[\cos\left[(2 \cdot \pi)\frac{t}{100}\right]\right]\right]\right]\right]$$

$$\text{DFT\_im} := \sum_t \left[\text{DFT\_test}_t \cdot \left(\sin\left(2 \cdot \pi \frac{t}{100}\right)\right)\right]$$

$$\text{DFT\_re} = 35.355$$

$$\text{DFT\_im} = 35.355$$

$$\Theta := a\tan\left(\frac{\text{DFT\_im}}{\text{DFT\_re}}\right)$$

$$\Theta \cdot \frac{180}{\pi} = 45$$

$$\text{DFT\_ABS\_VAL} := \sqrt{(\text{DFT\_re})^2 + (\text{DFT\_im})^2}$$

$$\text{DFT\_ABS\_VAL} = 50$$

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are proffered by way of example to facilitate comprehension of the invention and should not be construed to limit the scope thereof.

What is claimed is:

1. A method for driving an electrostrictive or magnetostrictive transducer, comprising:
   applying an amplifier output voltage across said transducer;
   processing a feedback signal from said transducer to determine amplitude and phase characteristics of said feedback signal;
   using the determined amplitude and phase characteristics to calculate a motional voltage of a transducer equivalent circuit having capacitive, inductive and resistive components, the calculating of the motional voltage including subtracting a voltage drop across a static capacitor of the transducer equivalent circuit as a function of load and maintaining constant a theoretical voltage across motion components of the transducer equivalent circuit;
   modifying said output voltage by the calculated value of said motional voltage; and
   feeding a current to said transducer in an amount to maintain the voltage drop across said transducer at the modified value of said output voltage.

2. A method for driving an electrostrictive or magnetostrictive transducer, comprising:
   applying an amplifier output voltage across said transducer;
   processing a feedback signal from said transducer to determine amplitude and phase characteristics of said feedback signal;
   using the determined amplitude and phase characteristics to calculate a motional voltage of a transducer equivalent circuit having capacitive, inductive and resistive components;
   modifying said output voltage by the calculated value of said motional voltage; and feeding a current to said transducer in an amount to maintain the voltage drop across said transducer at the modified value of said output voltage, wherein said output voltage has an output frequency, the processing of said feedback including using the output frequency as a reference wave comprised of a pure fundamental sinusoid of the output frequency in a Fourier decomposition with the feedback signal to determine the phase and amplitude of the fundamental sine wave.

3. The method defined in claim 2 wherein the processing of the feedback includes separating out the pure fundamental sinusoid from the feedback signal and determining phase and amplitude information by:

multiplying samples of one cycle of the fundamental sinusoid with samples of the feedback signal divided by the number of samples, and summing the products;

obtaining a real part by using a cosine reference wave and an imaginary part by using a sin reference wave, the real part and the imagining part forming a resultant complex quantity;

computing the amplitude of the pure fundamental sinusoid of the feedback signal as the absolute value of the complex quantity; and computing the phase of the pure fundamental sinusoid of the feedback signal as the arctangent of the imaginary part over the real part.

4. The method defined in claim 3 wherein a single cycle is used in any one determination of amplitude and phase.

5. The method defined in claim 3 wherein only the fundamental sinusoid of the feedback signal is determined, the harmonics being irrelevant to driving the electrostrictive or magnetostrictive transducer.

6. An electronic generator to drive an electromechanical load, comprising:

a. a waveform generator component digitally synthesizing an electrical waveform of a desired frequency;

b. an amplifier section connected at a control input to an output of said waveform generator component, said amplifier section adjusting at least one of a voltage and a current of said waveform and generating an output waveform of a desired type and for delivery to input leads of the electromechanical load;

c. computing means operatively connected at least indirectly to said waveform generator component for analyzing voltage and current information and generating a control signal fed to said waveform generator component;

d. said computing means being programmed to process voltage and current waveform information to determine at least a phase difference between voltage and current waveforms, e. said computing means being further programmed to compare the determined phase difference to a phase difference command and to generate a phase error signal fed at least indirectly to said waveform generator component for causing same to adjust its output frequency to result in a predetermined operating point as a function of phase, f. said computing means being additionally programmed to compare at least one of voltage and current amplitude respectively to a voltage amplitude command and a current amplitude command and generate an amplitude error signal for inducing said amplifier section to change its output amplitude to result in a predetermined amplitude for a respective one of said voltage and current waveforms, g. said computing means being also programmed to process a feedback signal from the electromechanical load to determine amplitude and phase characteristics of said feedback signal, the processing of said feedback signal including using said output frequency as a reference wave comprised of a pure fundamental sinusoid of the output frequency in a Fourier decomposition with the feedback signal to determine said phase difference and said one of said voltage and current amplitude as functions of the phase and amplitude of the fundamental sine wave.

7. The electrical waveform generator defined in claim 6 wherein said computing means accesses a memory for storing voltage and current waveform information, said computing means being programmed to calculate a motional current of said electromechanical load from the waveform data stored in said memory.

8. The electrical waveform generator defined in claim 7 wherein said computing means is further programmed to compute a clamped or static capacitance value of said electromechanical load from waveform data stored in said memory.

9. The electrical waveform generator defined in claim 8 wherein said computing means is additionally programmed to determine resonant frequencies of said electromechanical load from the waveform data stored in said memory, the calculated motional current and the computed clamped or static capacitance value.

10. The electrical waveform generator defined in claim 7 wherein said computing means is also programmed to determine an actual mechanical vibration amplitude of said electromechanical load from the calculated motional current.

11. The electrical waveform generator defined in claim 6, further comprising first filter means for generating said phase error signal and applying a first error signal to said waveform generator component, also comprising second filter means for generating said amplitude error signal and applying a second error signal to said control input of said amplifier section.

12. The electrical waveform generator defined in claim 11 wherein said first filter means and said second filter means are each realized by at least one of software and hardware.

13. The electrical waveform generator defined in claim 6 wherein said computing means is further programmed to store, in a memory, samples of control loop error during start up transients.

14. The electrical waveform generator defined in claim 13 wherein said computing means is further programmed to analyze said samples of control loop error to determine loop performance and stability.

15. The electrical waveform generator defined in claim 6 wherein said computing means is further programmed to use stored voltage and current waveform information to determine voltage level values, current level values, and thereby calculate power levels taken from the group consisting of real and apparent power levels.

16. The electrical waveform generator defined in claim 15 wherein said computing means is further programmed to display said power levels on a user interface in absolute and/or relative scales or displays.

17. The electrical waveform generator defined in claim 16 wherein said computing means is further programmed to calculate the power factor between voltage and current signals from waveform signals stored in a memory.

18. The electrical waveform generator defined in claim 17 wherein said computing means is further programmed to display said power factor on the user interface in absolute and/or relative scales or displays.

19. The electrical waveform generator defined in claim 6 wherein said computing means is further programmed to resolve a zero cross point of said phase difference to a fine resolution by searching for a plus-to-minus or minus-to-plus change between two adjacent samples, signifying a crossing of the zero axis, to determine a ratio of an A/D value of one of said two adjacent samples to an absolute difference in A/D values between said two adjacent samples, to multiply said ratio by a sampling period time spacing between said two adjacent samples to determine where said zero cross point occurs, whereby a fine resolution of zero crossing time may be determined.

20. The electrical waveform generator defined in claim 19 wherein said computing means is further programmed to calculate a power factor between voltage and current signals from waveform signals stored in a memory, to derive a first phase angle from zero-crossing information and a second phase angle from said power factor, to compare said first phase angle with said second phase angle, to generate a command for changing the waveform generator frequency to maintain said predetermined operating point.

21. The electrical waveform generator defined in claim 6 wherein said computing means is further programmed to determine at least one of the group consisting of waveform amplitude information, waveform RMS voltage levels, spectral decomposition analysis of waveform information, real or equivalent circuit values of piezoelectric or magnetostrictive resonators, and phase error conditions, and phase or amplitude change rates.

22. The electrical waveform generator defined in claim 6 wherein said computing means is programmed to maintain a running window of waveform data with respect to time in a memory.

23. The electrical waveform generator defined in claim 6 wherein said computing means is further programmed to determine error levels between a resonant frequency of said electromechanical load and waveform generator output.

24. The electrical waveform generator defined in claim 6 wherein said computing means is further programmed to determine error levels between desired resonator mechanical vibratory amplitude and actual resonator mechanical vibratory amplitude.

25. The electrical waveform generator defined in claim 6 wherein correlated phase difference commands and amplitude commands are stored in a memory.

26. The electrical waveform generator defined in claim 6 wherein said computing means is further programmed to vary a phase difference command as a function of command amplitude for optimal tracking of desired operating point of said electromechanical load.

27. The electrical waveform generator defined in claim 6 wherein said computing means is further programmed to maintain control loop error in a type 0 phase locked loop constant, independent of frequency of operation.

28. The electrical waveform generator defined in claim 6 wherein said computing means is further programmed to use control loop parameters in a phase locked loop capture mode that may be different than control loop parameters in a phase locked loop locked mode.

29. The electrical waveform generator defined in claim 6 wherein said computing means is further programmed to carry out a network analysis automatically upon at least one of (i) detection of an abnormal operating condition and (ii) user command, said computing means executing a linear sweep from a first frequency to a second frequency to compile an impedance curve and a phase curve, said computing means storing results of said linear sweep as data samples in a memory.

30. The electrical waveform generator defined in claim 6 wherein said computing means is further programmed to operate in a fast pulsing mode, wherein phase-locked-loop parameters including frequency and loop error are held constant while said amplifier section is disabled during a recurring off period, so that said phase-locked-loop parameters are not updated during said off period, and wherein during a recurring on period, said amplifier section is re-enabled and said phase-locked-loop parameters are again updated continuously.

31. The electrical waveform generator defined in claim 6 wherein said electromechanical load is taken from the group consisting of a piezoelectric and a magnetostrictive transducer.

32. The electrical waveform generator defined in claim 6 wherein said amplifier section includes a filter network for shaping said output waveform and delivering said output waveform to said input leads of said electromechanical load.

33. The electrical waveform generator defined in claim 6 wherein said processor is configured to separate out the pure fundamental sinusoid from the feedback signal and determine phase and amplitude information by:
  multiplying samples of one cycle of the fundamental sinusoid with samples of the feedback signal divided by the number of samples, and summing the products;
  obtaining a real part by using a cosine reference wave and an imaginary part by using a sin reference wave, the real part and the imagining part forming a resultant complex quantity;
  computing the amplitude of the pure fundamental sinusoid of the feedback signal as the absolute value of the complex quantity; and
  computing the phase of the pure fundamental sinusoid of the feedback signal as the arctangent of the imaginary part over the real part.

34. An electronic generator to drive an electromechanical load having at least one feedback crystal or coil, comprising:
  a. a waveform generator component digitally synthesizing an electrical waveform of a desired frequency;
  b. an amplifier section connected at a control input to an output of said waveform generator component, said amplifier section adjusting at least one of a voltage and a current of said waveform and generating an output waveform of a desired type and for delivery to input leads of the electromechanical load;
  c. computing means operatively connected at least indirectly to said waveform generator component for analyzing voltage and current information and generating a control signal fed to said waveform generator component;
  d. said computing means accessing a memory for storing digitized voltage and current waveform information from said amplifier section and voltage and current waveform information from said feedback crystal or coil,
  e. said computing means being programmed to process the voltage and current waveform information in said memory to determine at least a phase difference between a feedback signal from said feedback crystal or coil and the voltage or current waveform across the electromechanical load,
  f. said computing means being further programmed to compare the determined phase difference to a phase difference command and to generate a phase error or correction signal fed at least indirectly to said waveform generator component for causing same to adjust its output frequency to result in a predetermined operating point as a function of phase, g. said computing means being additionally programmed to compare the amplitude of the signal from said feedback crystal or coil to a feedback amplitude command and generate an amplitude error signal for inducing said amplifier section to change its output amplitude to result in a predetermined amplitude level, h. said computing means being also programmed to process the voltage and current waveform information using said output frequency as a reference wave comprised of a pure fundamental sinusoid of the output frequency in a Fourier decomposition with the voltage and current waveform information in said memory to determine said phase difference and a voltage or current amplitude of the signal from said feedback coil or crystal as functions of the phase and amplitude of the fundamental sine wave.

35. The electrical waveform generator defined in claim 34, further comprising first filter means for generating said phase error signal and applying a first error signal to said waveform generator component, also comprising second filter means for generating said amplitude error signal to said control input of said amplifier section.

36. The electrical waveform generator defined in claim 35 wherein said first filter means and said second filter means are each realized by at least one of software and hardware.

37. The electrical waveform generator defined in claim 34 wherein said computing means is further programmed to store, in said memory, samples of control loop error during start up transients.

38. The electrical waveform generator defined in claim 37 wherein said computing means is further programmed to analyze said samples of control loop error to determine loop performance and stability.

39. The electrical waveform generator defined in claim 34 wherein said computing means is further programmed to use said stored voltage and current waveform information to determine voltage level values, current level values, and thereby calculate power levels taken from the group consisting of real and apparent power levels.

40. The electrical waveform generator defined in claim 39 wherein said computing means is further programmed to display said power levels on a user interface in absolute and/or relative scales or displays.

41. The electrical waveform generator defined in claim 40 wherein said computing means is further programmed to calculate the power factor between voltage and current signals from said waveform signals stored in said memory.

42. The electrical waveform generator defined in claim 41 wherein said computing means is further programmed to display said power factor on the user interface in absolute and/or relative scales or displays.

43. The electrical waveform generator defined in claim 34 wherein said computing means is further programmed to resolve a zero cross point of said phase difference to a fine resolution by searching for a plus-to-minus or minus-to-plus change between two adjacent samples, signifying a crossing of the zero axis, to determine a ratio of an A/D value of one of said two adjacent samples to an absolute difference in A/D values between said two adjacent samples, to multiply said ratio by a sampling period time spacing between said two adjacent samples to determine where said zero cross point occurs, whereby a fine resolution of zero crossing time may be determined.

44. The electrical waveform generator defined in claim 43 wherein said computing means is further programmed to calculate a power factor between voltage and current signals from waveform signals stored in said memory, to derive a first phase angle from zero-crossing information and a second phase angle from said power factor, to compare said first phase angle with said second phase angle, to generate a command for changing the waveform generator frequency to maintain said predetermined operating point.

45. The electrical waveform generator defined in claim 34 wherein said computing means is also programmed to determine an actual mechanical vibration amplitude of said electromechanical load from said feedback signal of said feedback crystal or coil.

46. The electrical waveform generator defined in claim 34 wherein said computing means is further programmed to compute a clamped or static capacitance value of said electromechanical load from waveform data stored in said memory.

47. The electrical waveform generator defined in claim 34 wherein said electromechanical load comprises a transducer and the voltage and current waveforms across the electromechanical load comprise transducer voltage and current waveforms, said computing means being further programmed to determine at least one of the group consisting of phase difference between transducer voltage and current waveforms, transducer voltage waveform amplitude information, current waveform amplitude information, feedback signal phase difference to either voltage or current waveform, feedback signal amplitude and frequency, waveform RMS voltage levels, spectral decomposition analysis of waveform information, real or equivalent circuit values of piezoelectric or magnetostrictive resonators, phase error conditions, and phase or amplitude change rates.

48. The electrical waveform generator defined in claim 34 wherein said computing means is programmed to maintain a running window of waveform data with respect to time in said memory.

49. The electrical waveform generator defined in claim 34 wherein said computing means is further programmed to determine error levels between a resonant frequency of said electromechanical load and waveform generator output.

50. The electrical waveform generator defined in claim 34 wherein said computing means is further programmed to determine error levels between desired resonator mechanical vibratory amplitude and actual resonator mechanical vibratory amplitude.

51. The electrical waveform generator defined in claim 34 wherein correlated phase difference commands and amplitude commands are stored in said memory.

52. The electrical waveform generator defined in claim 34 wherein said computing means is further programmed to vary a phase difference command as a function of command amplitude for optimal tracking of desired operating point of said electromechanical load.

53. The electrical waveform generator defined in claim 34 wherein said computing means is further programmed to maintain control loop error in a type 0 phase locked loop constant, independent of frequency of operation.

54. The electrical waveform generator defined in claim 34 wherein said computing means is further programmed to use control loop parameters in a phase locked loop capture mode that may be different than control loop parameters in a phase locked loop locked mode.

55. The electrical waveform generator defined in claim 34 wherein said computing means is further programmed to carry out a network analysis automatically upon at least one of (i) detection of an abnormal operating condition and (ii) user command, said computing means executing a linear sweep from a first frequency to a second frequency to compile an impedance curve and a phase curve, said computing means storing results of said linear sweep as data samples in said memory.

56. The electrical waveform generator defined in claim 34 wherein said computing means is further programmed to operate in a fast pulsing mode, wherein phase-locked-loop parameters including frequency and loop error are held constant while said amplifier section is disabled during a recurring off period, so that said phase-locked-loop parameters are not updated during said off period, and wherein during a recurring on period, said amplifier section is re-enabled and said phase-locked-loop parameters are again updated continuously.

57. The electrical waveform generator defined in claim 34 wherein said electromechanical load is taken from the group consisting of a piezoelectric and a magnetostrictive transducer.

58. The electrical waveform generator defined in claim 34, further comprising means for displaying voltage, current, phase and/or impedance curves on a user observable local or remote interface screen.

59. The electrical waveform generator defined in claim 34, further comprising means for deriving system operating and alarm states from displayed curves and visual or audio means for alerting a user as to said operating and alarm states.

60. The electrical waveform generator defined in claim 34 wherein said computing means is programmed to respond to alarm conditions by shutting down output, triggering alarms and/or changing output amplitude settings.

61. The electrical waveform generator defined in claim 34 wherein said amplifier section includes a filter network for shaping said output waveform and delivering said output waveform to said input leads of said electromechanical load.

62. The electrical waveform generator defined in claim 34 wherein said computing means is also programmed to compensate for a theoretical voltage drop across a capacitor of a transducer equivalent circuit as a function of load by alternatively increasing and decreasing the output voltage of said amplifier section by approximately a value $Vc_o$ to thereby maintain a theoretical voltage across motional components of the transducer equivalent circuit substantially constant, where value $V_{Co}$ is a voltage drop across the capacitor of the transducer equivalent circuit and is given by the equation:

$$V_{Co} = I * Xc_o = I/(2\pi f C_o)$$

where I is the current, f is the frequency of operation and $C_o$ is the capacitance of the capacitor in the transducer equivalent circuit.

63. The generator defined in claim 34 wherein said processor is configured to separate out the pure fundamental sinusoid from the feedback signal and determine phase and amplitude information by:

multiplying samples of one cycle of the fundamental sinusoid with samples of the feedback signal divided by the number of samples, and summing the products;

obtaining a real part by using a cosine reference wave and an imaginary part by using a sin reference wave, the real part and the imagining part forming a resultant complex quantity;

computing the amplitude of the pure fundamental sinusoid of the feedback signal as the absolute value of the complex quantity; and computing the phase of the pure fundamental sinusoid of the feedback signal as the arctangent of the imaginary part over the real part.

64. A method for driving an electromechanical load, comprising:

i. digitally synthesizing an electrical waveform of a desired frequency;

ii. feeding said electrical waveform to a control input of an amplifier section;

iii. operating said amplifier section to adjust at least one of a voltage and a current of said electrical waveform and generate an output waveform of a desired type;

iv. delivering said output waveform to input leads of the electromechanical load, thereby applying analog voltage and current waveforms across the electromechanical load;

v. automatically analyzing voltage and current information and generating a control signal therefrom, the generating of said electrical waveform being responsive to said control signal;

vi. the analyzing of said voltage and current information including processing stored digitized voltage and current waveform information to determine at least a phase difference between said voltage and current waveforms, vii. the analyzing of said voltage and current information further including comparing the determined phase difference to a phase difference command and generating a phase error signal;

viii. automatically adjusting an output frequency of said electrical waveform to result in a predetermined operating point as a function of phase, ix. the analyzing of said voltage and current information further including comparing at least one of voltage and current amplitude respectively to a voltage amplitude command and a current amplitude command and generating an amplitude error signal; and x. operating said amplifier section to automatically adjust an amplitude of said output waveform to result in a predetermined amplitude for a respective one of said voltage and current waveforms.

\* \* \* \* \*